(12) United States Patent
Mori et al.

(10) Patent No.: US 7,885,779 B2
(45) Date of Patent: Feb. 8, 2011

(54) MEASUREMENT ERROR CORRECTING METHOD AND ELECTRONIC COMPONENT CHARACTERISTIC MEASUREMENT DEVICE

(75) Inventors: Taichi Mori, Yasu (JP); Gaku Kamitani, Kyoto (JP); Hiroshi Tomohiro, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 869 days.

(21) Appl. No.: 11/563,338

(22) Filed: Nov. 27, 2006

(65) Prior Publication Data

US 2007/0084035 A1   Apr. 19, 2007

Related U.S. Application Data

(63) Continuation of application No. PCT/JP2005/000018, filed on Jan. 5, 2005.

(30) Foreign Application Priority Data

May 25, 2004 (JP) .............................. 2004-155172
Jun. 30, 2004 (JP) .............................. 2004-192561
Oct. 4, 2004  (JP) .............................. 2004-291990

(51) Int. Cl.
*G01R 35/00* (2006.01)

(52) U.S. Cl. ..................... 702/107; 702/117; 702/189; 702/196

(58) Field of Classification Search ................. 702/107, 702/117, 196; 324/601–605, 609, 612, 615
See application file for complete search history.

(56) References Cited

U.S. PATENT DOCUMENTS 6,697,749 B2   2/2004   Kamitani (Continued)

FOREIGN PATENT DOCUMENTS

DE   102 57 434 A1   6/2003

(Continued)

OTHER PUBLICATIONS

Official Communication issued in corresponding German Patent Application No. 11 2005 001 211.5, mailed on Sep. 30, 2009.

(Continued)

*Primary Examiner*—Drew A Dunn
*Assistant Examiner*—Mi'schita' Henson
(74) *Attorney, Agent, or Firm*—Keating & Bennett, LLP

(57) ABSTRACT

A measurement error correcting method and electronic component characteristic measuring device capable of accurately coping with an electronic component which includes nonsignal line ports and whose electrical characteristics are changed by a jig. The method includes the steps of measuring an electrical characteristic, with correcting-data-acquisition samples mounted on a test jig enabling measuring nonsignal line ports, and the samples mounted on a reference jig; measuring a through device in which a signal line port and a nonsignal line port are electrically connected to each other; determining a numerical expression for calculating, from results of measurement on the test jig, an estimated electrical characteristic value obtained on the reference jig; measuring an arbitrary electronic component, on the test jig; and calculating the estimated electrical characteristic value obtained on the reference jig.

18 Claims, 24 Drawing Sheets

U.S. PATENT DOCUMENTS

2003/0043897 A1* 3/2003 Papanikolaou et al. ...... 375/229
2004/0059529 A1* 3/2004 Kamitani ..................... 702/65
2006/0155498 A1* 7/2006 Dunsmore et al. .......... 702/107

FOREIGN PATENT DOCUMENTS

| | | |
|---|---|---|
| JP | 2000-162257 | 6/2000 |
| JP | 2003-294820 | 10/2003 |

OTHER PUBLICATIONS

Kamitani, "A Method to Correct Difference of In-Fixture Measurements Among Fixtures on RF Devices", Asia-Pacific Microwave Conference, 2003, pp. 1094-1097, vol. 2.

Written Opinion completed Apr. 5, 2005.

International Search Report issued Apr. 26, 2005.

Dunsmore et al. "New Methods for Correlating Fixtured Measurements", *Asia Pacific Microwave Conference*, pp. 568-571, (2003).

* cited by examiner (a) REFERENCE JIG (b) TEST JIG (a)

(b)

(a)

(b)

(a)

(b)

(a)

(b)

(a)

(b)

(a)

(b)

(a)

REFLECTION ($S_{11}$)

(b)

TRANSMISSION ($S_{21}$, $S_{31}$)

(a)

(b)

| | NO DISCONNECTION (GOOD ITEM) | DISCONNECTION (BAD ITEM) |
|---|---|---|
| $S_{24}$ | -4.16 [dB] | -92.52 [dB] |
| $S_{34}$ | -3.62 [dB] | -90.15 [dB] |

MEASUREMENT ERROR CORRECTING METHOD AND ELECTRONIC COMPONENT CHARACTERISTIC MEASUREMENT DEVICE

CROSS-REFERENCE TO RELATED APPLICATIONS

The present application is a 35 U.S.C. §111(a) continuation claiming 35 U.S.C. §120 priority of PCT/JP2005/000018 filed on Jan. 5, 2005, which claims priority of JP2004-155172 filed May 25, 2004, JP2004-192561 filed Jun. 30, 2004, and JP2004-291990 filed Oct. 4, 2004, incorporated by reference.

BACKGROUND OF THE INVENTION

1. Technical Field

The present invention relates to measurement error correcting methods and electronic component characteristic measuring devices, and more specifically to a measurement error correcting method and an electronic component characteristic measuring device which measure electrical characteristics of an electronic component at signal line ports connected to signal lines, concerning application or detection of a high frequency signal, and at nonsignal line ports other than the signal line ports, with the electronic component mounted on a test jig, and which calculate estimated values that will be obtained if the electronic component is measured with it mounted on a reference jig enabling measuring only the signal line ports.

2. Background Art

In the related art, a surface mount electronic component having no coaxial connector, such as the above electronic component, may be measured concerning its electrical characteristics, with it mounted on a jig including a coaxial connector, and the jig and a measuring device connected via a coaxial cable. In this measurement, variance of properties of each jig and variance of characteristics of each coaxial cable and each measuring device cause a measurement error.

Regarding the coaxial cable and the measuring device, by performing measurement in a state in which a standard unit having reference characteristics is connected to the measuring device via the coaxial cable, an error on the side of the measuring device from an end of the coaxial cable to which the standard unit is connected can be identified.

However, regarding the jig, an error in electrical characteristic between a terminal on which the electronic component is mounted and the coaxial connector connecting to the coaxial cable cannot be accurately identified. In addition, it is not easy to perform adjustment so that characteristics are identical between jigs. In particular, it is very difficult to adjust jigs in a broad bandwidth so that characteristics are identical between the jigs.

Accordingly, it has been proposed to perform measuring correcting-data-acquisition samples in a state with the samples mounted on a plurality of jigs, deriving a numerical expression for correcting a relative error between a certain jig (this is called a "reference jig") and a different jig (this is called a "test jig"), and, from results obtained with an arbitrary electronic component mounted on the test jig, using the numerical expression to calculate estimated values of electrical characteristics that will be obtained if the electronic component is mounted on the reference jig. For example, the reference jig is used to guarantee electrical characteristics for a user, and the test jig is used for measurement for good item selection in an electronic component production process. See, for example, Non-Patent Document 1: GAKU KAMITANI (Murata Manufacturing Co., Ltd.), "A METHOD TO CORRECT DIFFERENCE OF IN-FIXTURE MEASUREMENTS AMONG FIXTURES ON RF DEVICES," APMC, Vol. 2, pp. 1094-1097, 2003; and Non-Patent Document 2: J. P. DUNSMORE, L. BETTS (Agilent Technologies), "NEW METHODS FOR CORRELATING FIXTURED MEASUREMENTS," APMC, Vol. 1, pp. 568-571, 2003.

This technique can cope with a case in which an electronic component to be measured includes only signal line ports (ports connected to signal lines concerning application or detection of a high frequency signal for measuring an arbitrary electrical characteristic of the electronic component by using a measuring device).

However, when the electronic component to be measured includes ports (connected to nonsignal lines, having no relationship with electrical characteristic measurement, such as a power-supply line and a GND line, and hereinafter referred to as "nonsignal line ports") other than the signal line ports, electrical characteristics of the electronic component, themselves, are changed by properties of a jig connected to the nonsignal line ports. Accordingly, as shown in FIG. 1, this cannot cope with a case in which a characteristic guarantee is performed, with the test jig used for measurement with the nonsignal line ports connected to the measuring device, and the reference jig used with the nonsignal line ports unchanged (i.e., without connecting the nonsignal line ports to the measuring device).

For example, as shown in FIG. 29(a), in the case of an electronic component 2 (this type of electronic component is hereinafter referred to as a "shunt type") including a nonsignal line port connected to the ground for high frequency via some element, a reference jig 4 have coaxial connectors 4a and 4b connected to signal line ports of the electronic component 2 and an element 4s connected to a nonsignal line port of the electronic component 2. In addition, as shown in FIG. 29(b), a test jig 6 includes coaxial connectors 6a and 6b connected to the nonsignal lines port of the electronic component 2 and a coaxial connector 6c connected to the nonsignal line port of the electronic component 2.

Also, as shown in FIG. 30(a), in the case of an electronic component 3 (this type of electronic component is hereinafter referred to as a "float type") in which an element is connected between nonsignal line ports, a reference jig 5 includes coaxial connectors 5a and 5b connected to signal line ports of the electronic component 3 and an element 5s connected between the nonsignal line ports of the electronic component 3. For the nonsignal line ports, RF measurement is not performed. In addition, as shown in FIG. 30(b), a test jig 7 includes coaxial connectors 7a and 7b connected to the signal line ports of the electronic component 3 and coaxial connectors 7c and 7d connected to the nonsignal line ports. Not only for the signal line ports but also for the nonsignal line ports, RF measurement is performed.

SUMMARY OF THE INVENTION

In view of the above circumstance, the present invention is intended to provide a measurement error correcting method and electronic component characteristic measuring device capable of handling, with high accuracy, an electronic component which includes nonsignal line ports other than signal line ports and whose electrical characteristics are changed by characteristics of a jig connected to the nonsignal line ports.

MEANS FOR SOLVING THE PROBLEMS

To solve the above problem, the present invention provides measurement error correcting methods which may include the following steps:

For example, in this measurement error correcting method, regarding an electronic component including signal line ports connected to signal lines concerning application or detection of a radio frequency signal, and nonsignal line ports other than the signal line ports, from results of measuring the signal line ports and the nonsignal line ports, with the electronic component mounted on a test jig, an estimated electrical characteristic value of the electronic component that will be obtained if the signal line ports are measured with the electronic component mounted on a reference jig enabling measuring only the signal line ports is calculated. The measurement error correcting method includes first to fifth steps. In the first step, with at least three types of correcting-data-acquisition samples mounted on the test jig, and the correcting-data-acquisition samples mounted on the reference jig, an electrical characteristic of at least one of signal line ports of each of the correcting-data-acquisition samples is measured. In the second step, a correcting-data-acquisition through device in which at least one of signal line ports and at least one of nonsignal line ports are electrically connected to each other is prepared, the signal line port and the nonsignal line port is measured with the correcting-data-acquisition through device mounted on the test jig, and the signal line port is measured with the correcting-data-acquisition through device mounted on the reference jig. The third step determines, on the basis of measurement values obtained in the first and second steps, a numerical expression for calculating, from the results of measuring the signal line ports and the nonsignal line ports, with the electronic component mounted on the test jig, the estimated electrical characteristic value of the electronic component that will be obtained if the signal line ports are measured with the electronic component mounted on the reference jig. In the fourth step, the signal line ports and the nonsignal line ports are measured with the electronic component, which is arbitrary, mounted on the test jig. In the fifth step, on the basis of measurement values obtained in the fourth step, by using the numerical expression determined in the third step, the estimated electrical characteristic value of the electronic component that will be obtained if the signal line ports are measured with the electronic component mounted on the reference jig is calculated.

In the above-described configuration, on the basis of measurement values in the first step, for the signal line ports, correction of relative measurement error between the reference jig and the test jig can be performed. From the result of correction of the signal line port and measurements in the second step, also for the nonsignal line ports, correction of the relative measurement error between the reference jig and the test jig can be performed.

According to the above-described configuration, a measurement error can be corrected not only for signal line ports but also for nonsignal line ports. Thus, for an arbitrary electronic component, from results of measuring the signal line ports and the nonsignal line ports, with the electronic component mounted on a test jig, electrical characteristics of the electronic component in a case in which the electronic component is mounted on a reference jig can be accurately estimated.

Preferably, in the third step, the numerical expression for the nonsignal line ports is represented by the following expression:

$$C2\Gamma = \frac{S_{11D} - S_{11I}}{S_{11D} * S_{22I} - S_{11I} * S_{22I} + S_{21I} * S_{12I}} \quad \text{[Expression 1]}$$

by using scattering matrix $S_I$ (whose elements are represented by $S_{11I}$, $S_{12I}$, $S_{21I}$, and $S_{22I}$) obtained such that the results of measuring, in the second step, the signal line ports and the nonsignal line ports, with the correcting-data-acquisition through device mounted on the test jig, are substituted for "the numerical expression for calculating, from the results of measuring the signal line ports and the nonsignal line ports, with the electronic component mounted on the test jig, the estimated electrical characteristic value of the electronic component that will be obtained if the signal line ports are measured with the electronic component mounted on the reference jig", and measurement value $S_{11D}$ for the signal line port in a state in which the correcting-data-acquisition through device in the second step is mounted on the reference jig.

In other words, in the case of an electronic component of the "shunt type" including nonsignal line ports, assuming a relative correction adapter having a feature of changing an electrical characteristic measured with the electronic component mounted on the test jig into an electrical characteristic measured with the electronic component mounted on the reference jig, from measurement values obtained in the first step, the relative correction adapter is found concerning the signal line ports. By combining the relative correction adapter with a scattering matrix which is obtained in the second step and which is obtained by measurement with the correcting-data-acquisition through device mounted on the test jig, from measurement values obtained with the correcting-data-acquisition through device mounted on the test jig, scattering matrix $S_I$ estimating an electrical characteristic in a state with only the signal line ports mounted on the reference jig is determined. In the second step, the measurement values obtained with the correcting-data-acquisition through device mounted on the reference jig correspond to estimated values obtained by combining the relative correction adapter concerning the nonsignal line ports with a terminal pair of the nonsignal line ports of $S_I$. This can derive the above expression.

By using the relative correction adapter of the nonsignal line ports derived by the above expression, electrical characteristics obtained with the electronic component mounted on the reference jig, in which the nonsignal line ports are not measured, can be accurately estimated.

Preferably, the electronic component includes at least both first and second line ports as the signal line ports and at least both first and second nonsignal line ports as the nonsignal line ports, with an element connected between the first and second nonsignal line ports; for calculating an estimated electrical characteristic value between the first and second signal line ports, which are affected by the first and second nonsignal line ports of the electronic component, in the first step, electrical characteristics are measured at the signal line ports, for each of the correcting-data-acquisition samples, corresponding to the first and second signal line ports of the electronic component; in the second step, in the correcting-data-acquisition through device, electrical connection is established between a signal line port of the correcting-data-acquisition through device which corresponds to the first signal line port of the electronic component, and a nonsignal line port of the correcting-data-acquisition through device which corresponds to the first nonsignal line port of the electronic component, and electrical connection is established between a signal line port of the correcting-data-acquisition through device which corresponds to the second signal line port of the electronic component, and a nonsignal line port of the correcting-data-acquisition through device which corresponds to the second nonsignal line port of the electronic component; in the third step, as the numerical expression for calculating the estimated electrical characteristic value between the first and second signal line ports, which are affected by the first and second nonsignal line ports of the electronic component, a transmission parameter matrix as represented by the following expression:

$$(CA) = (T1_{thru})^{-1} \cdot (D_{thru}) \cdot (T2_{thru})^{-1} \qquad (a)$$

or a scattering parameter matrix obtained by transforming the transmission parameter matrix is used by using: transmission parameter matrix ($T1_{thru}$) for between the signal line port corresponding to the first signal line port of the electronic component and the nonsignal line port corresponding to the first nonsignal line port of the electronic component, transmission parameter matrix ($T2_{thru}$) for between the signal line port corresponding to the second signal line port of the electronic component and the nonsignal line port corresponding to the second nonsignal line port of the electronic component, both transmission parameter matrices being obtained such that the results of measuring, in the second step, the signal line ports and the nonsignal line ports, with the correcting-data-acquisition through device mounted on the test jig, are substituted for "the numerical expression for calculating, from the results of measuring the signal line ports, with the electronic component mounted on the test jig, the estimated electrical characteristic value of the electronic component that will be obtained if the signal line ports are measured with the electronic component mounted on the reference jig"; and transmission parameter matrix ($D_{thru}$) between the signal line ports corresponding to the first and second signal line ports of the electronic component in a state in which the correcting-data-acquisition through device obtained in the second step is mounted on the test jig.

In other words, in the case of an electronic component of the "float type" including nonsignal line ports, for the electronic component, which is arbitrary, assuming a relative correction adapter having a feature of changing electrical characteristics obtained with the electronic component mounted on the test jig into electrical characteristics obtained with the electronic component mounted on the reference jig, from the measurement values obtained in the first step, the relative correction adapter is found concerning the signal line ports. The relative correction adapter is combined with a scattering matrix which is obtained in the second step and which is obtained by measurement with the correcting-data-acquisition through device mounted on the test jig. That is, transmission parameter matrix ($T1_{thru}$) obtained by performing the above combination on a scattering matrix between the signal line port corresponding to the first signal line port of the electronic component and the nonsignal line port corresponding to the first nonsignal line port, and transmission parameter matrix ($T2_{thru}$) obtained by performing the above combination on a scattering matrix between the signal line port corresponding to the second signal line port of the electronic component and the nonsignal line port corresponding to the second nonsignal line port are determined. In the second step, from measurement values obtained with the correcting-data-acquisition through device mounted on the reference jig, transmission parameter matrix ($D_{thru}$), obtained with the correcting-data-acquisition through device mounted on the reference jig, between the signal line ports corresponding to the first and second signal line ports of the electronic component, is determined. When the relative correction adapter between the nonsignal line ports corresponding to the first and second nonsignal line ports of the electronic component is represented by (CA), the following expression (b) holds:

$$(D_{thru}) = (T1_{thru}) \cdot (CA) \cdot (T2_{thru}) \qquad (b)$$

By multiplying both sides of this expression (b) by inverse matrices $(T1_{thru})^{-1}$ and $(T2_{thru})^{-1}$ from either side, the above expression (a) can be derived.

By using the relative correction adapter of the nonsignal line ports derived by the above expression (a), electrical characteristics obtained with the electronic component mounted with the reference jig, in which the nonsignal line ports are not measured, can be accurately estimated.

Preferably, in the fifth step, in the calculation, assuming a relative correction adapter having a feature of changing the electrical characteristic measured with the electronic component mounted on the test jig into an electrical characteristic measured with the electronic component mounted on the reference jig, for the nonsignal line ports, the numerical expression for the nonsignal line ports in the third step is used as the relative correction adapter for estimation.

Preferably, in the correcting-data-acquisition through device measured in the second step, a transmission parameter between the signal line port and the nonsignal line port is equal to −10 dB or greater.

In this case, between a signal line port and a nonsignal line port, the output signal is such that it is one order of magnitude less than the input signal. Thus, correction of a measurement error can be accurately performed.

Preferably, in the correcting-data-acquisition through device measured in the second step, a transmission parameter between the signal line port and the nonsignal line port is equal to −20 dB or greater.

In this case, for example, when a nonsignal line port on the reference jig totally reflects a signal, a signal that is measured is such that it is one order of magnitude less than a signal input from the signal line port. Thus, the relative correction adapter of the nonsignal line ports can be accurately found.

In addition, to solve the above-described problem, the present invention provides electronic component characteristic measuring devices which may include the following features:

For example, in this electronic component characteristic measuring device, regarding an electronic component including signal line ports connected to signal lines concerning application or detection of a radio frequency signal, and nonsignal line ports other than the signal line ports, from results of measuring the signal line ports and the nonsignal line ports, with the electronic component mounted on a test jig, an estimated electrical characteristic value of the electronic component that will be obtained if the signal line ports are measured with the electronic component mounted on a reference jig enabling measuring only the signal line ports is calculated. The electronic component characteristic measuring device comprises measurement means, storage means, numerical expression determining means, and electrical characteristic estimating means. The measurement means measures the signal line ports and the nonsignal line ports, with the electronic component mounted on the test jig. The storage means stores first measurement data obtained such that, with at least three types of correcting-data-acquisition samples mounted on the test jig, and the correcting-data-acquisition samples mounted on the reference jig, an electrical characteristic of at least one of signal line ports of each of the correcting-data-acquisition samples is measured, second measurement data obtained such that, with a correcting-data-acquisition through device mounted on the test jig, the correcting-data-acquisition through device having electrical connection between at least one signal line port among signal line ports and at least one nonsignal line port among nonsignal line ports, the signal line port and the nonsignal line port are measured with the correcting-data-acquisition through device mounted on the test jig, third measurement data obtained by measuring the signal line port, with the correcting-data-acquisition through device mounted on the reference jig. The numerical expression determining means determines, on the basis of the first data to third data stored in the storage means, a numerical expression for calculating, from the results of measuring the signal line ports and the nonsignal line ports, with the electronic component mounted on the test jig, the estimated electrical characteristic value of the electronic component that will be obtained if the signal line ports are measured with the electronic component mounted on the reference jig. The electrical characteristic estimating means determines, for the electronic component, which is arbitrary, on the basis of measurement values obtained by measurement of the measurement means, by using the numerical expression determined by the numerical expression determining means, the estimated electrical characteristic value of the electronic component that will be obtained if the signal line ports are measured with the electronic component mounted on the reference jig.

In the above-described configuration, on the first measurement data, on the basis of the first measurement data, a relative measurement error between the reference jig and the test jig for the signal line ports can be corrected. From the result of the correction for the signal line ports, and the second measurement data and the third measurement data, also for the nonsignal line ports, a relative measurement error between the reference jig and the test jig can be corrected.

According to the above-described configuration, not only for signal line ports but also for nonsignal line ports, a measurement error can be corrected. Thus, from results of measuring the signal line ports and the nonsignal line ports, with an arbitrary electronic component mounted on a test jig, an electrical characteristic obtained with the electronic component mounted on a reference jig can be accurately estimated.

The first measurement data to third measurement data may be obtained either by measurement means of the above-described electronic component characteristic measuring device or by a different measuring device other than the above-described electronic component characteristic measuring device. In the latter case, measurement data obtained by the different measuring device is stored in storage means of the above-described electronic component characteristic measuring device.

Preferably, the numerical expression determined for the nonsignal line ports by the numerical expression determining means is represented by the following expression:

$$C2\Gamma = \frac{S_{11D} - S_{11I}}{S_{11D} * S_{22I} - S_{11I} * S_{22I} + S_{21I} * S_{12I}} \quad \text{[Expression 2]}$$

by using scattering matrix $S_I$ (whose elements are represented by $S_{11I}$, $S_{12I}$, $S_{21I}$, and $S_{22I}$) obtained such that the second measurement data is substituted for "the numerical expression for calculating, from the results of measuring the signal line ports, with the electronic component mounted on the test jig, the estimated electrical characteristic value of the electronic component that will be obtained if the signal line ports are measured with the electronic component mounted on the reference jig", the numerical expression being obtained from the first measurement data, and measurement value $S_{11D}$ for the signal line port in a state in which the correcting-data-acquisition through device, which is the third data, is mounted on the reference jig.

In other words, in the case of an electronic component of the "shunt type" including nonsignal line ports, assuming a relative correction adapter having a feature of changing an electrical characteristic measured with the electronic component mounted on the test jig into an electrical characteristic measured with the electronic component mounted on the reference jig, from the first measurement data, a relative correction adapter is found concerning the signal line ports. By combining the relative correction adapter with a scattering matrix which is obtained from the second measurement data and which is obtained by measurement with the correcting-data-acquisition through device mounted on the test jig, from measurement values obtained with the correcting-data-acquisition through device mounted on the test jig, scattering matrix $S_I$ estimating an electrical characteristic in a state with only the signal line ports mounted on the reference jig is determined. Measurement values obtained with the correcting-data-acquisition through device, which is the third measurement data, mounted on the reference jig correspond to estimated values obtained by combining the relative correction adapter concerning the nonsignal line ports with a terminal pair of the nonsignal line port of $S_I$.

By using the relative correction adapter of the nonsignal line ports derived by the above expression, an electrical characteristic obtained with the electronic component mounted on the reference jig, in which the nonsignal line ports are not measured, can be accurately estimated.

Preferably, the electronic component includes at least both first and second line ports as the signal line ports and at least both first and second nonsignal line ports as the nonsignal line ports, with an element connected between the first and second nonsignal line ports; for the first measurement data, electrical characteristics are measured at the signal line ports, for each of the correcting-data-acquisition samples, corresponding to the first and second signal line ports of the electronic component; the correcting-data-acquisition through device for use in obtaining the second measurement data and the third measurement data has electrical connection between a signal line port of the correcting-data-acquisition through device which corresponds to the first signal line port of the electronic component, and a nonsignal line port of the correcting-data-acquisition through device which corresponds to the first nonsignal line port of the electronic component, and electrical connection between a signal line port of the correcting-data-acquisition through device which corresponds to the second signal line port of the electronic component, and a nonsignal line port of the correcting-data-acquisition through device which corresponds to the second nonsignal line port of the electronic component; as the numerical expression, determined by the numerical expression determining means, for calculating the estimated electrical characteristic value between the first and second signal line ports, which are affected by the first and second nonsignal line ports of the electronic component, a transmission parameter matrix as represented by the following expression:

$$(CA) = (T1_{thru})^{-1} \cdot (D_{thru}) \cdot (T2_{thru})^{-1} \quad \text{(a)}$$

or a scattering parameter matrix obtained by transforming the transmission parameter matrix is used by using: transmission parameter matrix ($T1_{thru}$) for between the signal line port corresponding to the first signal line port of the electronic component and the nonsignal line port corresponding to the first nonsignal line port of the electronic component, transmission parameter matrix ($T2_{thru}$) for between the signal line port corresponding to the second signal line port of the electronic component and the nonsignal line port corresponding to the second nonsignal line port of the electronic component, both transmission parameter matrices being obtained by substituting the second measurement data for "the numerical expression for calculating, from the results of measuring the signal line ports, with the electronic component mounted on the test jig, the estimated electrical characteristic value of the electronic component that will be obtained if the signal line ports are measured with the electronic component mounted on the reference jig", the numerical expression being obtained from the first measurement data; and transmission parameter matrix ($D_{thru}$), obtained from the third measurement data, between the signal line ports corresponding to the first and second signal line ports of the electronic component in a state with the correcting-data-acquisition through device mounted on the test jig.

In other words, in the case of an electronic component of the "float type" including nonsignal line ports, for the electronic component, which is arbitrary, assuming a relative correction adapter having a feature of changing electrical characteristics obtained with the electronic component mounted on the test jig into electrical characteristics obtained with the electronic component mounted on the reference jig, from first measurement data, the relative correction adapter is found concerning the signal line ports. The relative correction adapter is combined with a scattering matrix which is obtained from second measurement data and which is obtained by measurement with the correcting-data-acquisition through device mounted on the test jig. That is, transmission parameter matrix ($T1_{thru}$) obtained by performing the above combination on a scattering matrix between the signal line port corresponding to the first signal line port of the electronic component and the nonsignal line port corresponding to the first nonsignal line port, and transmission parameter matrix ($T2_{thru}$) obtained by performing the above combination on a scattering matrix between the signal line port corresponding to the second signal line port of the electronic component and the nonsignal line port corresponding to the second nonsignal line port are determined. From measurement values obtained with the correcting-data-acquisition through device mounted on the reference jig, which is the third measurement data, transmission parameter matrix ($D_{thru}$), obtained with the correcting-data-acquisition through device mounted on the reference jig, between the signal line ports corresponding to the first and second signal line ports of the electronic component, is determined. When the relative correction adapter between the nonsignal line ports corresponding to the first and second nonsignal line ports of the electronic component is represented by (CA), the following expression (b) holds:

$$(D_{thru}) = (T1_{thru}) \cdot (CA) \cdot (T2_{thru}) \quad \text{(b)}$$

By multiplying both sides of this expression (b) by inverse matrices $(T1_{thru})^{-1}$ and $(T2_{thru})^{-1}$ from either side, the above expression (a) can be derived.

By using the relative correction adapter of the nonsignal line ports derived by the above expression (a), electrical characteristics obtained with the electronic component mounted with the reference jig, in which the nonsignal line ports are not measured, can be accurately estimated.

Preferably, in the electrical characteristic estimating means, regarding the electronic component, which is arbitrary, assuming a relative correction adapter having a feature of changing the electrical characteristic measured with the electronic component mounted on the test jig into an electrical characteristic measured with the electronic component mounted on the reference jig, for the nonsignal line ports, the numerical expression for the nonsignal line ports determined for the nonsignal line ports by the numerical expression determining means is used as the relative correction adapter for estimation.

Preferably, in the correcting-data-acquisition through device for acquiring the second measurement data and the third measurement data, a transmission parameter between the signal line port and the nonsignal line port is equal to $-10$ dB or greater.

In this case, between a signal line port and a nonsignal line port, the output signal is such that it is one order of magnitude less than the input signal. Thus, correction of a measurement error can be accurately performed.

Preferably, in the correcting-data-acquisition through device for acquiring the second measurement data and the third measurement data, a transmission parameter between the signal line port and the nonsignal line port is equal to $-20$ dB or greater in both ways.

In this case, for example, when a nonsignal line port on the reference jig totally reflects a signal, a signal that is measured is such that it is one order of magnitude less than a signal input from the signal line port. Thus, the relative correction adapter of the nonsignal line ports can be accurately found.

In addition, to solve the above-described problem, the present invention provides the following electronic component characteristic measuring device.

In this electronic component characteristic measuring device, regarding an electronic component including signal line ports connected to signal lines concerning application or detection of a radio frequency signal, and nonsignal line ports other than the signal line ports, from results of measuring the signal line ports and the nonsignal line ports, with the electronic component mounted on a test jig, an estimated electrical characteristic value of the electronic component that will be obtained if the signal line ports are measured with the electronic component mounted on a reference jig enabling measuring only the signal line ports is calculated. The electronic component characteristic measuring device comprises measurement means, numerical expression storing means, and electrical characteristic estimating means. The measurement means measures the signal line ports and the nonsignal line ports, with the electronic component mounted on the test jig. The numerical expression storing means stores "a numerical expression for calculating, from the results of measuring the signal line ports and the nonsignal line ports, with the electronic component mounted on the test jig, the estimated electrical characteristic value of the electronic component that will be obtained if the signal line ports are measured with the electronic component mounted on the reference jig". The numerical expression is determined on the basis of first measurement data obtained such that, with at least three types of correcting-data-acquisition samples mounted on the test jig, and the correcting-data-acquisition samples mounted on the reference jig, an electrical characteristic of at least one of signal line ports of each of the correcting-data-acquisition samples is measured, second measurement data obtained such that, with a correcting-data-acquisition through device mounted on the test jig, the correcting-data-acquisition through device having electrical connection between at least one signal line port among signal line ports and at least one nonsignal line port among nonsignal line ports, the signal line port and the nonsignal line port are measured with the correcting-data-acquisition through device mounted on the test jig, and third measurement data obtained by measuring the signal line port, with the correcting-data-acquisition through device mounted on the reference jig. The electrical characteristic estimating means determines, for the electronic component, which is arbitrary, on the basis of measurement values obtained by measurement of the measurement means, by using the numerical expression determined by the numerical expression determining means, the estimated electrical characteristic value of the electronic component that will be obtained if the signal line ports are measured with the electronic component mounted on the reference jig.

In the above-described configuration, on the first measurement data, on the basis of the first measurement data, a relative measurement error between the reference jig and the test jig for the signal line ports can be corrected. From the result of the correction for the signal line ports, and the second measurement data and the third measurement data, also for the nonsignal line ports, a relative measurement error between the reference jig and the test jig can be corrected. In the above-described configuration, the numerical expression storing means stores a numerical expression for calculating an estimated electrical characteristic value of the electronic component by correcting measurement error not only for the signal line ports and but also for the nonsignal line ports. By using the numerical expression, for an arbitrary electronic component, from results of measuring the signal line ports and the nonsignal line ports, with the electronic component mounted on the test jig, an electrical characteristic obtained with the electronic component mounted on the reference jig can be accurately estimated.

In the above-described configuration, the numerical expression for calculating the electrical characteristic of the electronic component is determined beforehand such that the electronic component characteristic measuring device or a different measuring device uses the test jig and the reference jig to perform measurement.

According to the above-described configuration, if the numerical expression is determined beforehand for the test jig, by storing the numerical expression in the numerical expression storing means of the electronic component characteristic measuring device, the test jig can be used for an arbitrary electronic component characteristic measuring device. Therefore, test jigs and electronic component characteristic measuring devices can be freely combined for use.

Preferably, the numerical expression, for the nonsignal line ports, stored in the numerical expression storing means is represented by the following expression:

$$C2\Gamma = \frac{S_{11D} - S_{11I}}{S_{11D} * S_{22I} - S_{11I} * S_{22I} + S_{21I} * S_{12I}} \quad \text{[Expression 2]}$$

by using scattering matrix $S_I$ (whose elements are represented by $S_{11I}$, $S_{12I}$, $S_{21I}$, and $S_{22I}$) obtained such that the second measurement data is substituted for "the numerical expression for calculating, from the results of measuring the signal line ports, with the electronic component mounted on the test jig, the estimated electrical characteristic value of the electronic component that will be obtained if the signal line ports are measured with the electronic component mounted on the reference jig", the numerical expression being obtained from the first measurement data, and measurement value $S_{11D}$ for the signal line port in a state in which the correcting-data-acquisition through device, which is the third data, is mounted on the reference jig.

In other words, in the case of an electronic component of the "shunt type" including nonsignal line ports, assuming a relative correction adapter having a feature of changing an electrical characteristic measured with the electronic component mounted on the test jig into an electrical characteristic measured with the electronic component mounted on the reference jig, from the first measurement data, a relative correction adapter is found concerning the signal line ports. By combining the relative correction adapter with a scattering matrix which is obtained from the second measurement data and which is obtained by measurement with the correcting-data-acquisition through device mounted on the test jig, from measurement values obtained with the correcting-data-acquisition through device mounted on the test jig, scattering matrix $S_I$ estimating an electrical characteristic in a state with only the signal line ports mounted on the reference jig is determined. Measurement values obtained with the correcting-data-acquisition through device, which is the third measurement data, mounted on the reference jig correspond to estimated values obtained by combining the relative correction adapter concerning the nonsignal line ports with a terminal pair of the nonsignal line port of $S_I$.

By using the relative correction adapter of the nonsignal line ports derived by the above expression, an electrical characteristic obtained with the electronic component mounted on the reference jig, in which the nonsignal line ports are not measured, can be accurately estimated.

Preferably, the electronic component includes at least both first and second line ports as the signal line ports and at least both first and second nonsignal line ports as the nonsignal line ports, with an element connected between the first and second nonsignal line ports; for the first measurement data, electrical characteristics are measured at the signal line ports, for each of the correcting-data-acquisition samples, corresponding to the first and second signal line ports of the electronic component; the correcting-data-acquisition through device for use in obtaining the second measurement data and the third measurement data has electrical connection between a signal line port of the correcting-data-acquisition through device which corresponds to the first signal line port of the electronic component, and a nonsignal line port of the correcting-data-acquisition through device which corresponds to the first nonsignal line port of the electronic component, and electrical connection between a signal line port of the correcting-data-acquisition through device which corresponds to the second signal line port of the electronic component, and a nonsignal line port of the correcting-data-acquisition through device which corresponds to the second nonsignal line port of the electronic component; as the numerical expression, stored in the numerical expression storing means, for calculating the estimated electrical characteristic value between the first and second signal line ports, which are affected by the first and second nonsignal line ports of the electronic component, a transmission parameter matrix as represented by the following expression:

$$(CA) = (T1_{thru})^{-1} \cdot (D_{thru}) \cdot (T2_{thru})^{-1} \quad (a)$$

or a scattering parameter matrix obtained by transforming the transmission parameter matrix is used by using: transmission parameter matrix ($T1_{thru}$) for between the signal line port corresponding to the first signal line port of the electronic component and the nonsignal line port corresponding to the first nonsignal line port of the electronic component, transmission parameter matrix ($T2_{thru}$) for between the signal line port corresponding to the second signal line port of the electronic component and the nonsignal line port corresponding to the second nonsignal line port of the electronic component, both transmission parameter matrices being obtained by substituting the second measurement data for "the numerical expression for calculating, from the results of measuring the signal line ports, with the electronic component mounted on the test jig, the estimated electrical characteristic value of the electronic component that will be obtained if the signal line ports are measured with the electronic component mounted on the reference jig", the numerical expression being obtained from the first measurement data, and transmission parameter matrix ($D_{thru}$), between the signal line ports corresponding to the first and second signal line ports of the electronic component in a state with the correcting-data-acquisition through device mounted on the test jig, obtained from the third measurement data.

In other words, in the case of an electronic component of the "float type" including nonsignal line ports, for the electronic component, which is arbitrary, assuming a relative correction adapter having a feature of changing electrical characteristics obtained with the electronic component mounted on the test jig into electrical characteristics obtained with the electronic component mounted on the reference jig, from first measurement data, the relative correction adapter is found concerning the signal line ports. The relative correction adapter is combined with a scattering matrix which is obtained from second measurement data and which is obtained by measurement with the correcting-data-acquisition through device mounted on the test jig. That is, transmission parameter matrix ($T1_{thru}$) obtained by performing the above combination on a scattering matrix between the signal line port corresponding to the first signal line port of the electronic component and the nonsignal line port corresponding to the first nonsignal line port, and transmission parameter matrix ($T2_{thru}$) obtained by performing the above combination on a scattering matrix between the signal line port corresponding to the second signal line port of the electronic component and the nonsignal line port corresponding to the second nonsignal line port are determined. From measurement values obtained with the correcting-data-acquisition through device mounted on the reference jig, which is the third measurement data, transmission parameter matrix ($D_{thru}$), obtained with the correcting-data-acquisition through device mounted on the reference jig, between the signal line ports corresponding to the first and second signal line ports of the electronic component, is determined. When the relative correction adapter between the nonsignal line ports corresponding to the first and second nonsignal line ports of the electronic component is represented by (CA), the following expression (b) holds:

$$(D_{thru}) = (T1_{thru}) \cdot (CA) \cdot (T2_{thru}) \quad (b)$$

By multiplying both sides of this expression (b) by inverse matrices $(T1_{thru})^{-1}$ and $(T2_{thru})^{-1}$ from either side, the above expression (a) can be derived.

By using the relative correction adapter of the nonsignal line ports derived by the above expression (a), electrical characteristics obtained with the electronic component mounted with the reference jig, in which the nonsignal line ports are not measured, can be accurately estimated.

Preferably, in the electrical characteristic estimating means, regarding the electronic component, which is arbitrary, assuming a relative correction adapter having a feature of changing the electrical characteristic measured with the electronic component mounted on the test jig into an electrical characteristic measured with the electronic component mounted on the reference jig, for the nonsignal line ports, the numerical expression for the nonsignal line ports determined for the nonsignal line ports by the numerical expression determining means is used as the relative correction adapter for estimation.

Preferably, in the correcting-data-acquisition through device for acquiring the second measurement data and the third measurement data, a transmission parameter between the signal line port and the nonsignal line port is equal to −10 dB or greater.

In this case, between a signal line port and a nonsignal line port, the output signal is such that it is one order of magnitude less than the input signal. Thus, correction of a measurement error can be accurately performed.

Preferably, in the correcting-data-acquisition through device for acquiring the second measurement data and the third measurement data, a transmission parameter between the signal line port and the nonsignal line port is equal to −20 dB or greater in both ways.

In this case, for example, when a nonsignal line port on the reference jig totally reflects a signal, a signal that is measured is such that it is one order of magnitude less than a signal input from the signal line port. Thus, the relative correction adapter of the nonsignal line ports can be accurately found.

ADVANTAGES

According to a measurement error correcting method and electronic component characteristic measuring device of the present invention, an electronic component which includes nonsignal line ports other signal line ports and whose electrical characteristics are changed by a characteristic of a jig connected to the nonsignal line ports can be accurately measured.

This makes it possible that, regarding an electronic component including signal line ports and nonsignal line ports, from measurement results using a test jig in a production process, device characteristics can be estimated under conditions equal to a to-user guaranteeing state using a reference jig. Accordingly, a more accurate electrical characteristic guarantee for a user is made possible. In addition, increased accuracy of quality determination also improves a yield rate. Furthermore, since it is not necessary to adjust the reference jig and the test jig, to even a case in which an electronic component has a broad bandwidth, the present invention can be applied with no difficulties.

Other features and advantages of the present invention will become apparent from the following description of embodiments of invention which refers to the accompanying drawings.

DESCRIPTION OF EMBODIMENTS OF THE INVENTION

Figure 1:
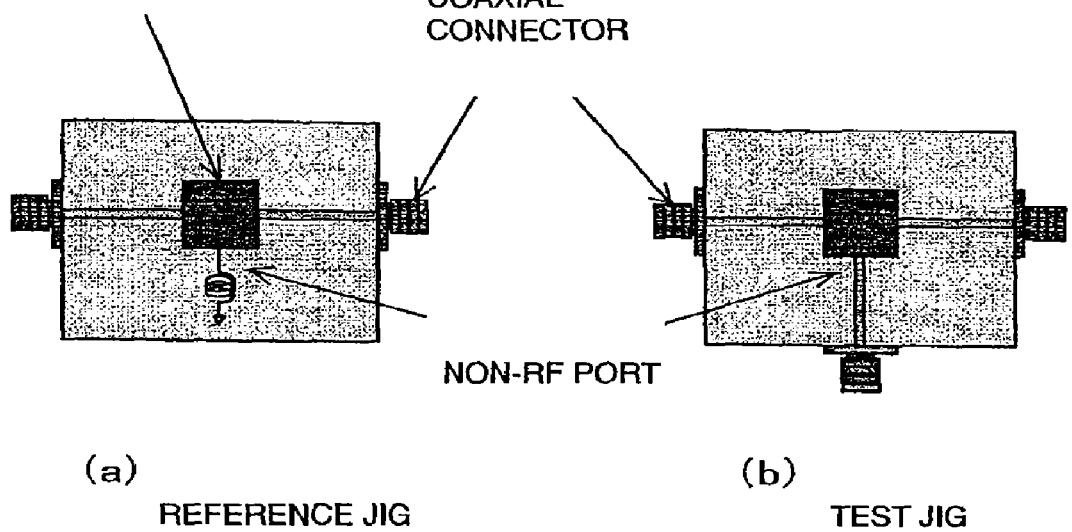
FIG. 1 consists of illustrations of a reference jig and a test jig.

The following reference numerals are used in this disclosure:

10, 11 electronic components
20 reference jig
26 measuring device
30 test jig
36 measuring device (electronic component characteristic measuring device)
52 display unit
54 operation control
56 measuring unit (measuring means)
58 control unit
60 storage unit (storage means, numerical expression storing means)
62 computation unit (numerical expression determining means, electrical characteristic estimating means)
64 interface unit
76 measuring device
86 measuring device (electronic component characteristic measuring device)
100 inductor (element)
110 electronic component
112 port (first signal line port)
114 port (second signal line port)
116 port (first nonsignal line port)
118 port (second nonsignal line port)
120 reference jig
126 measuring device
130 test jig
136 measuring device (electronic component characteristic measuring device)
140 through device
210 electronic component
220 reference jig
230 test jig (electronic component characteristic measuring device)

Embodiments of the present invention are described below with reference to FIGS. 2a to 28.

First Embodiment

Electronic components of the "shunt type" including nonsignal line ports are described with reference to FIGS. 2a to 13 and FIGS. 30 to 34.

Figure 2A:
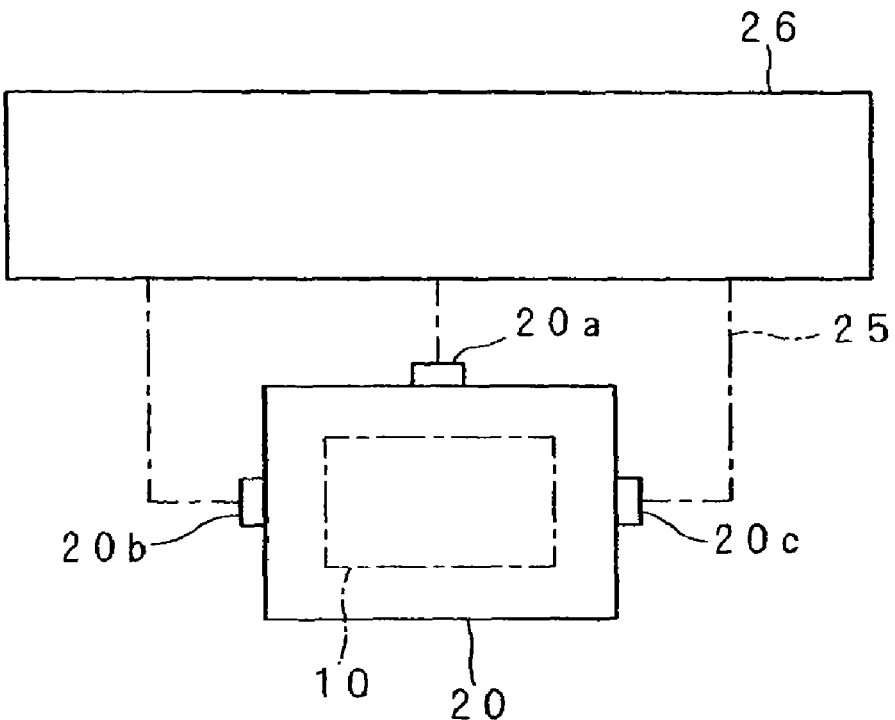
FIG. 2a is an entire configuration illustration in the case of using a reference jig for measurement.
Figure 2B:
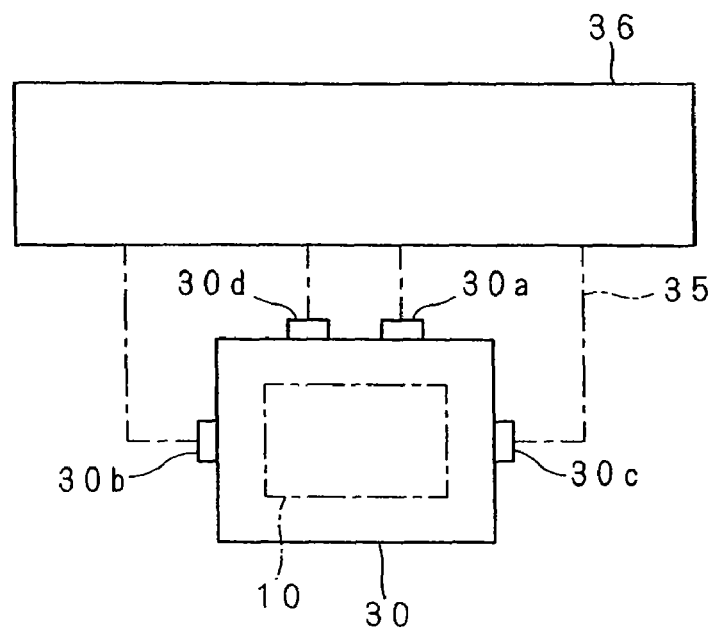
FIG. 2b is an entire configuration illustration in the case of using a test jig for measurement.

First, a measurement error correcting method is described. As shown in FIGS. 2a and 2b, an electronic component 10 can be measured by using different jigs 20 and 30. One jig 20 (hereinafter referred to as the "reference jig 20") is used, for example, to guarantee electrical characteristics for a user. The other jig 30 (hereinafter referred to as a "test jig 30") is used, for example, to select good items in an electronic component production process.

A numerical expression for correcting a relative measurement error between the jigs 20 and 30 is derived beforehand, whose details are described later. An arbitrary electronic component is measured with it mounted on the test jig 30, whereby an electrical characteristic that will be obtained if the electronic component is mounted on the reference jig 20 can be estimated by using the derived numerical expression.

FIGS. 2a and 2b show examples of a case in which the electronic component 10 has three signal line ports and one nonsignal line port.

As shown in FIG. 2a, the reference jig 20 includes a mount portion and coaxial connectors 20a, 20b, and 20c. The mount part includes a connection terminal (not shown) that is fixed to a terminal of the electronic component 10 by applying pressure, and the connection terminal and the coaxial connectors 20a, 20b, and 20c are electrically connected to one another. The three signal line ports of the electronic component 10 are respectively connected to a measuring device 26 through the coaxial connectors 20a, 20b, and 20c and three coaxial cables 25. In other words, when the electronic component 10 is mounted on the reference jig 20, only the signal line ports are measured by using the measuring device 26.

As shown in FIG. 2b, when the electronic component 10 is mounted on the other jig 30, that is, the test jig 30, the signal line ports and the nonsignal line port are measured by using a measuring device 36. The test jig 30 includes a mount portion for mounting the electronic component 10 and coaxial connectors 30a, 30b, 30c, and 30d. The mount portion includes a connection terminal (not shown) that is fixed to a terminal of the electronic component 10 by applying pressure, and the connection terminal and the coaxial connectors 30a, 30b, 30c, and 30d are electrically connected to one another. Three signal line ports and one nonsignal line port of the electronic component 10 are respectively connected to a measuring device 36 through the coaxial connectors 30a, 30b, 30c, and 30d and four coaxial cables 35.

The coaxial cables 25 and the measuring device 26 are calibrated, with a standard unit connected to ends (portions connecting to the coaxial connectors 20a, 20b, and 20c) of the coaxial cables 25, the standard unit having known electrical characteristics.

For example, network analyzers are used as the measuring devices 26 and 36. A network analyzer has not only a function of simply measuring electrical characteristics of an electronic component including a plurality of ports and being used in high frequencies, but also a function of outputting calculated results by using a arbitrarily set program to perform calculation on measured raw data.

Next, the fundamental principle of a method for estimating electrical characteristics of an electronic component from measurement results obtained when the electronic component is mounted on a test jig is described.

For brevity of description, a two-port circuit for a two-port sample (DUT) including one signal line port and one nonsignal line port is exemplified below. However, this may extend to an n-port circuit (n represents an integer equal to or greater than 3) such as a four-port circuit as shown in FIG. 2b.

Figure 3A:
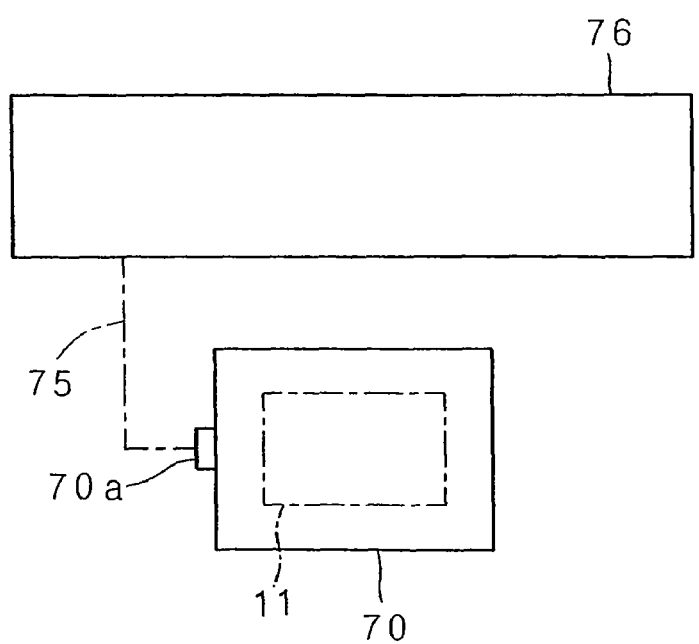
FIG. 3a is an entire configuration illustration in the case of using a reference jig for measurement.

As shown in FIG. 3a, a reference jig 70 on which an electronic component 11 including one signal line port and one nonsignal line port is mounted includes only a coaxial connector 70a. Only the signal line port of the electronic component 11 is connected to a measuring device 76 through the coaxial connector 70a and a coaxial cable 75, and only the signal line port is measured.

Figure 3B:
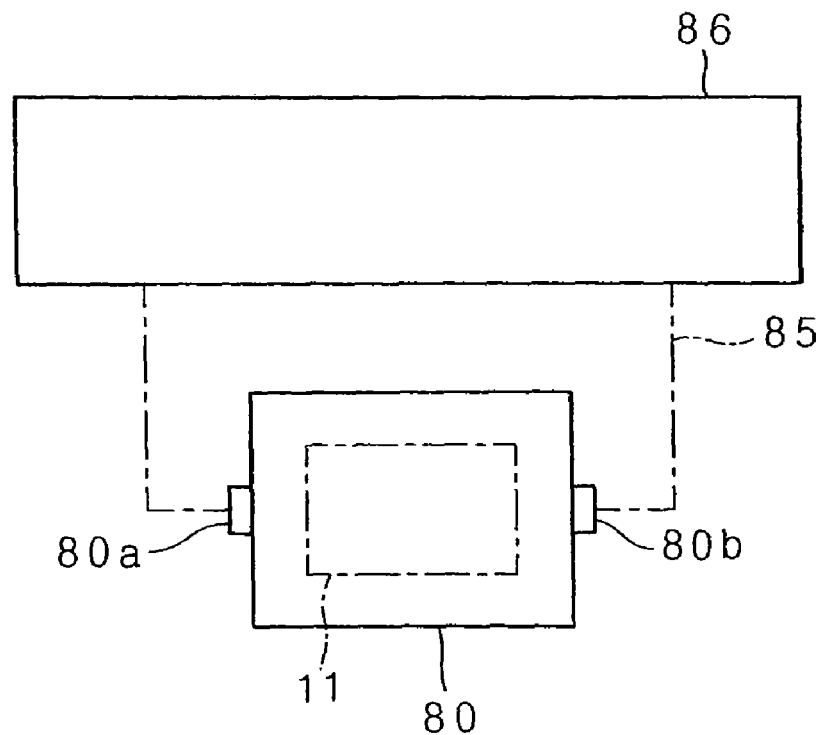
FIG. 3b is an entire configuration illustration in the case of using a test jig for measurement.

As shown in FIG. 3b, a test jig 80 on which the electronic component 11 including one signal line port and one nonsignal line port is mounted includes a coaxial connector 80a for the signal line port and a coaxial connector 80b for the nonsignal line port. The signal line port and nonsignal line port of the electronic component 11 are connected to a measuring device 86 through the coaxial connectors 80a and 80b, and a coaxial cable 85, and the signal line port and the nonsignal line port are measured.

FIG. 5(a) shows a two-port circuit in a case in which the electronic component 11 (hereinafter referred to as the "sample 11") including one signal line port and one nonsignal line port is mounted on the reference jig 70. An error characteristic on one port side 21 (the side of terminal pair 00') of the reference jig 70 connected to the signal line port of the sample 11 is represented by a scattering matrix ($E_{D1}$), and a characteristic of the sample 11 is represented by a scattering matrix ($S_{DUT}$). Terminal pair 00' corresponds to the coaxial connector of the reference jig 70. From terminal 0' on the signal line port side, measurement $S_{11D}$ in a case in which the sample 11 is mounted on the reference jig 70 is obtained. When the sample 11 is mounted on the reference jig 70, in order to measure only the signal line port, an error characteristic of the other port side 22 of the reference jig 70 that is connected to the nonsignal line port of the sample 11 is only represented by reflection parameter $\Gamma_{D2}$.

FIG. 5(b) shows a two-port circuit in a case in which the sample 11 is mounted on a test jig 80. An error characteristic of one port side 31 (the side of terminal pair 11') of the test jig 80 that is connected to the signal line port of the sample 11 is represented by a scattering matrix ($E_{T1}$), and a characteristic of the sample 11 is represented by a scattering matrix ($S_{DUT}$). From terminal 1' of the signal line port side, measurement $S_{11T}$ in a case in which the sample 11 is mounted on the test jig 80 is obtained. When the sample 11 is mounted on the test jig 80, in order to also measure the nonsignal line port, an error characteristic of the other port side of the test jig 80 that is connected to the nonsignal line port of the sample 11 is represented by a scattering matrix ($E_{T2}$). From a terminal 2 on the nonsignal line port side, measurement $S_{21T}$ in a case in which the sample 11 is mounted on the test jig 80 is obtained. Terminals pairs 11' and 22' correspond to coaxial connector connection portions in which calibration of the measuring device 86 is performed at ends of the coaxial cables 85.

FIG. 6(a) shows a state in which, as denoted by reference numerals 33 and 34, adapters $(E_{T1})^{-1}$ and $(E_{T2})^{-1}$ for neutralizing error characteristics ($E_{T1}$) and ($E_{T2}$) of the test jig 80 are connected across the circuit in FIG. 5(b). These adapters $(E_{T1})^{-1}$ and $(E_{T2})^{-1}$ are theoretically obtained by converting scattering matrices ($E_{T1}$) and ($E_{T2}$) of the error characteristics into transfer matrices, finding the inverse matrices of the transfer matrices, and converting the inverse matrices into scattering matrices again. Boundary portions 38 and 39 between error characteristics ($E_{T1}$) and ($E_{T2}$) and the adapters $(E_{T1})^{-1}$ and $(E_{T2})^{-1}$ are hereinafter referred to as "calibration planes 38 and 39". On the calibration planes 38 and 39, measurements $S_{11T}$ and $S_{21T}$ in the case in which the sample 11 is mounted on the test jig 80 are obtained. Since, in this circuit, errors of the test jig 80 are eliminated, measurements $S_{11DUT}$ and $S_{21DUT}$ of the sample itself are obtained from terminals on both sides of the circuit.

The circuit in FIG. 6(a) is equivalent to only the sample 11. Thus, similarly to FIG. 5(a), by connecting, across the circuit, the scattering matrix ($E_{D1}$) of the signal line port side 21 of the reference jig 70 and the reflection parameter $\Gamma_{D2}$ of the error characteristic of the nonsignal line port side of the reference jig 70, the circuit in FIG. 6(b) is formed.

Figure 6:
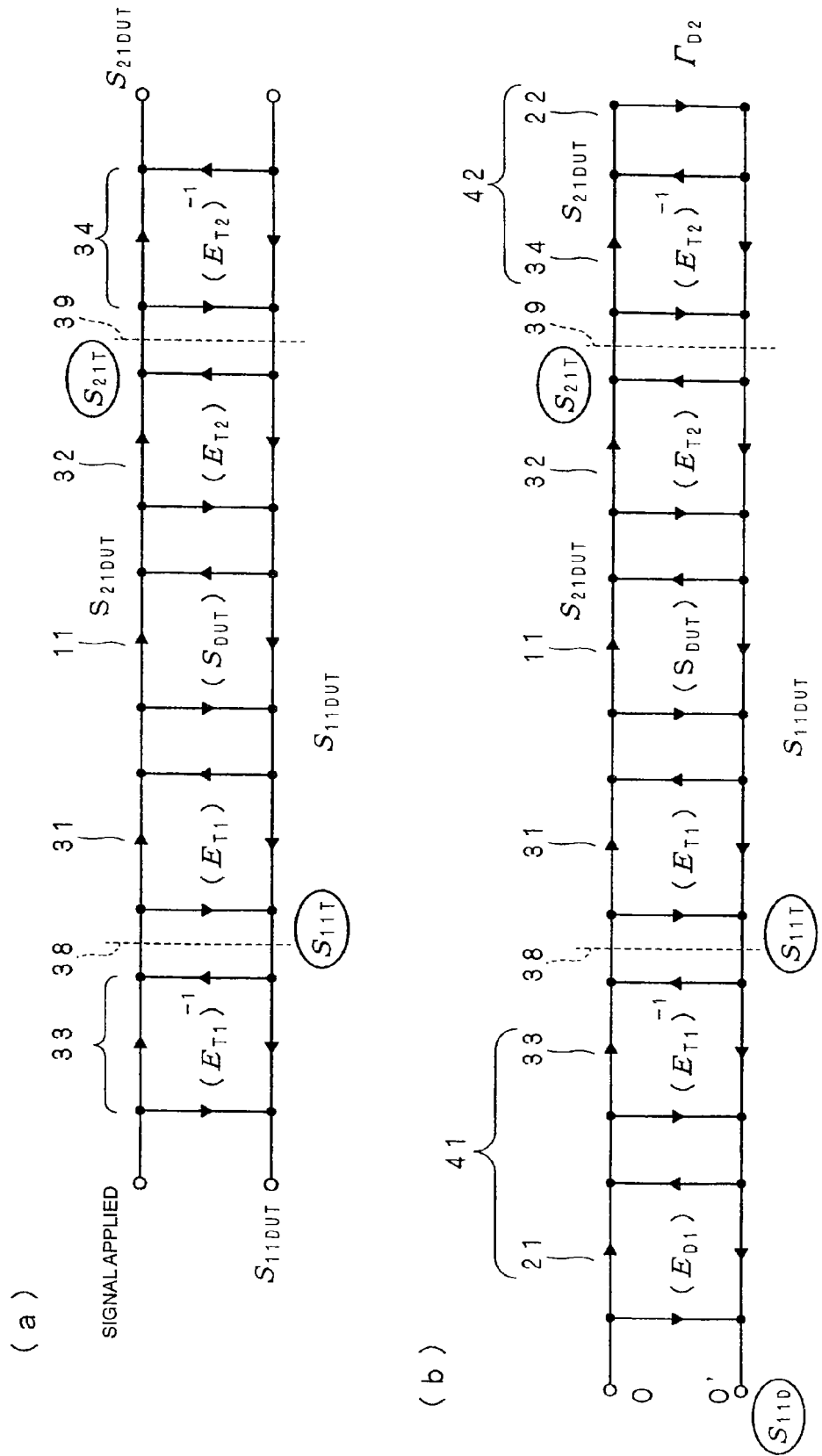
FIG. 6 consists of two-port circuit diagrams showing the fundamental principle of error correction of the present invention.

In FIG. 6(b), a scattering matrix of the entirety of the circuit can be found because value $S_{11D}$ of terminal 0' is known. Assuming the two-port circuit in the portion 41 between terminal pair 00' and the calibration plane 38, since values $S_{11D}$ and $S_{11T}$ of the terminals on both sides are known, a scattering matrix in which ($E_{D1}$) and $(E_{T1})^{-1}$ are combined can be found. Assuming the two-port circuit in the portion between the calibration planes 38 and 39, values $S_{11T}$, $S_{21T}$, $S_{12T}$, and $S_{22T}$ on both sides can be directly measured on the calibration planes. Thus, their scattering matrices can be found. By combining the scattering matrix of the portion 41 between terminal pair 00' and the scattering matrix of the portion between the calibration planes 38 and 39, scattering matrices from terminal pair 00' through the calibration plane 39 can be found. Regarding the other portion, that is, the portion on the right of the calibration plane 39, the scattering matrix in which $(E_{T2})^{-1}$ and $\Gamma_{D2}$ are combined can be found from the scattering matrix of the entire circuit shown in FIG. 6(*b*) and the combined scattering matrix between terminal pair 00' and the calibration plane 39.

Figure 7:
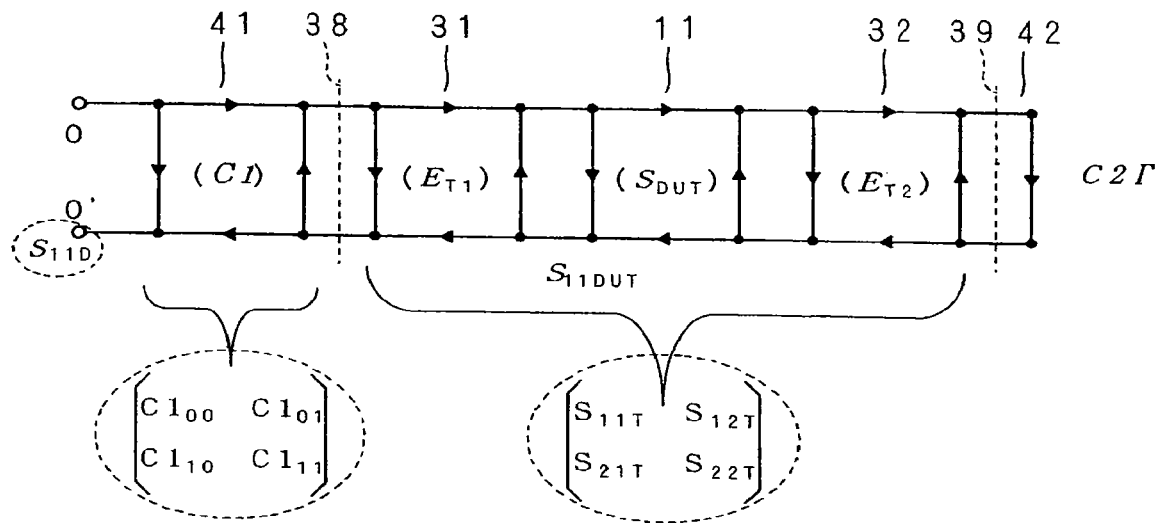
FIG. 7 is a two-port circuit diagram showing the fundamental principle of error correction of the present invention.

In other words, when the scattering matrix combined for the portion 41 between terminal pair 00' and the calibration plane 38 is represented by (C1), and the reflection parameter in which $(E_{T2})^{-1}$ and $\Gamma_{D2}$ are combined for the portion 42 on the right of the calibration plane 39 is represented by C2Γ, the circuit is as shown in FIG. 7.

This (C1) is a so-called "relative correction adapter" and can be independently found for each port. Assuming that elements of (C1) are $C1_{00}$, $C1_{01}$, $C1_{10}$, and $C1_{11}$, $C1_{01}=C1_{10}$ on the basis of the reciprocity theorem. Therefore, the relative correction adapter (C1) can be determined by preparing at least three samples for obtaining correcting data that have different electrical characteristics for a targeted port, and measuring the samples in a state with them mounted on the reference jig 70 and the test jig 80.

In other words, regarding the three samples for obtaining correcting data, when it is assumed that a measurement of $S_{11T}$ in a state mounted on the test jig 80, a measurement of $S_{11D}$ in a state mounted on the reference jig 70 be $S_{11Ti}$ and $S_{11Di}$ (i=1, 2, 3), respectively, scattering parameters ($C1_{00}$, $C1_{01}$, $C1_{10}$, $C1_{11}$) can be found by the following expression (1).

[Expression 4] (1)

$C1_{00} = (S_{11D1} * S_{11D3} * S_{11T2} * S_{11T3} - S_{11D1} * S_{11D2} * S_{11T2} * S_{11T3} -$ $S_{11D2} * S_{11D3} * S_{11T1} * S_{11T3} + S_{11D1} * S_{11D2} * S_{11T1} * S_{11T3} +$ $S_{11D2} * S_{11D3} * S_{11T1} * S_{11T2} - S_{11D1} * S_{11D3} * S_{11T1} * S_{11T2}) /$ $(S_{11D3} * S_{11T2} * S_{11T3} - S_{11D2} * S_{11T2} * S_{11T3} -$ $S_{11D3} * S_{11T1} * S_{11T3} + S_{11D1} * S_{11T1} * S_{11T3} +$ $S_{11D2} * S_{11T1} * S_{11T2} - S_{11D1} * S_{11T1} * S_{11T2})$ $C1_{01} = C1_{10} = \pm Sqrt((S_{11D2} - S_{11D1}) * (S_{11D3} - S_{11D1}) *$ $(S_{11D3} - S_{11D2}) * (S_{11T2} - S_{11T1}) *$ $(S_{11T3} - S_{11T1}) * (S_{11T3} - S_{11T2})) /$ $(S_{11D3} * S_{11T2} * S_{11T3} - S_{11D2} * S_{11T2} * S_{11T3} -$ $S_{11D3} * S_{11T1} * S_{11T3} + S_{11D1} * S_{11T1} * S_{11T3} +$ $S_{11D2} * S_{11T1} * S_{11T2} - S_{11D1} * S_{11T1} * S_{11T2})$ $C1_{11} = -(S_{11D2} * S_{11T3} - S_{11D1} * S_{11T3} - S_{11D3} * S_{11T2} +$ $S_{11D1} * S_{11T2} + S_{11D3} * S_{11T1} - S_{11D2} * S_{11T1}) /$ $(S_{11D3} * S_{11T2} * S_{11T3} - S_{11D2} * S_{11T2} * S_{11T3} -$ $S_{11D3} * S_{11T1} * S_{11T3} + S_{11D1} * S_{11T1} * S_{11T3} +$ $S_{11D2} * S_{11T1} * S_{11T2} - S_{11D1} * S_{11T1} * S_{11T2})$ Relative correction adapter C2Γ of the nonsignal line port is found from the scattering parameters ($C1_{00}$, $C1_{01}$, $C1_{10}$, and $C1_{11}$) found as described above and a measurement of a through device to which the signal line port and the nonsignal line port are connected.

Figure 8:
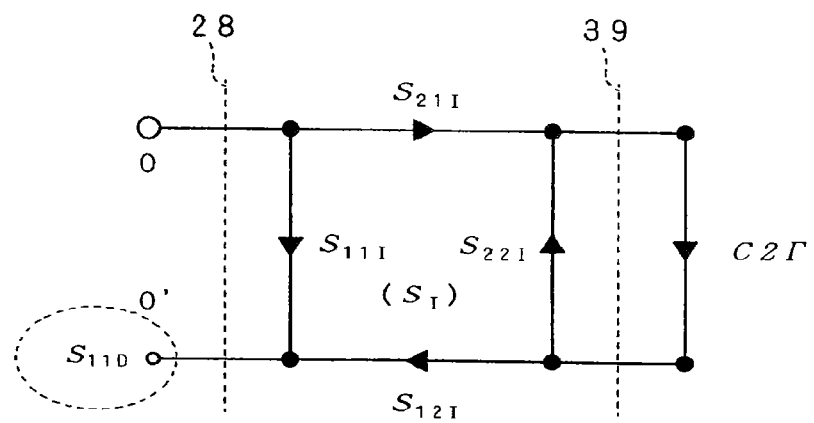
FIG. 8 is a two-port circuit diagram showing the fundamental principle of error correction of the present invention.

In other words, by performing measurement in a state in which the through device is mounted on the reference jig 70, measurement $S_{11D}$ is found. In addition, by performing measurement in a state in which the through device is mounted on the test jig 80, scattering parameters ($S_{11T}$, $S_{12T}$, $S_{21T}$, $S_{22T}$) of the state mounted on the test jig 80 are found. Regarding the portion on the left of the calibration plane 39, as shown in FIG. 8, scattering parameters ($S_{11I}$, $S_{12I}$, $S_{21I}$, $S_{22I}$) in which scattering parameters ($C1_{00}$, $C1_{01}$, $C1_{10}$, $C1_{11}$) and scattering parameters ($S_{11T}$, $S_{12T}$, $S_{21T}$, $S_{22}$T) are combined are found.

By using measurement $S_{11D}$ and scattering parameters ($S_{11T}$, $S_{12T}$, $S_{21T}$, $S_{22T}$), C2Γ is found by the following expression (2).

[Expression 5]

$$C2\Gamma = \frac{S_{11D} - S_{11I}}{S_{11D} * S_{22I} - S_{11I} * S_{22I} + S_{21I} * S_{12I}} \quad (2)$$

Correction adapter ($C1_{00}$, $C1_{01}$, $C1_{10}$, and $C1_{11}$) for the signal line port, determined as described above, and relative correction adapter C2Γ for the nonsignal line port are used in expression (3), which is described later, in order to estimate electrical characteristics of an arbitrary error characteristic.

The two-port sample 11 including one signal line port and one nonsignal line port is measured with it mounted on the test jig 80, scattering parameters ($S_{11T}$, $S_{12T}$, $S_{21T}$, $S_{22T}$) in a state with the electronic component mounted on the reference jig 70 are found, and the following expression (3) is used, whereby measurement $S_{11D}$ that will be obtained if measurement is performed in a state mounted on the reference jig 70 can be calculated.

[Expression 6]

$$S_{11D} = C1_{00} + \frac{\begin{array}{c}C1_{10} * C1_{01} * S_{11T} - C1_{10} * C1_{01} * C2\Gamma * S_{11T} * S_{22T} + \\ C1_{10} * C2\Gamma * C1_{01} * S_{21T} * S_{12T}\end{array}}{\begin{array}{c}1 - C1_{11} * S_{11T} - C2\Gamma * S_{22T} + \\ C1_{11} * C2\Gamma * S_{21T} * S_{12T} + C1_{11} * C2\Gamma * S_{11T} * S_{22T}\end{array}} \quad (3)$$

Also regarding an N-port electronic component including arbitrary M nonsignal line ports (M<N), the electronic component is measured with it mounted on a test jig, to find scattering parameters, and relative correction adapters corresponding to each signal line port and each nonsignal line port are combined, whereby a measurement that will be obtained if the electronic component is measured with it mounted on a reference jig.

The measuring devices 36 and 86 using the test jigs 30 and 80 are formed so as to perform the above measurement error correction for the nonsignal line port. The measuring devices 26 and 67 using the reference jigs 20 and 70 do not particularly need to be identical in configuration to the measuring devices 36 and 86 since they do not perform measurement for the nonsignal line port. However, if they are identical in configuration to the measuring devices 36 and 86, they are usable.

Figure 4:
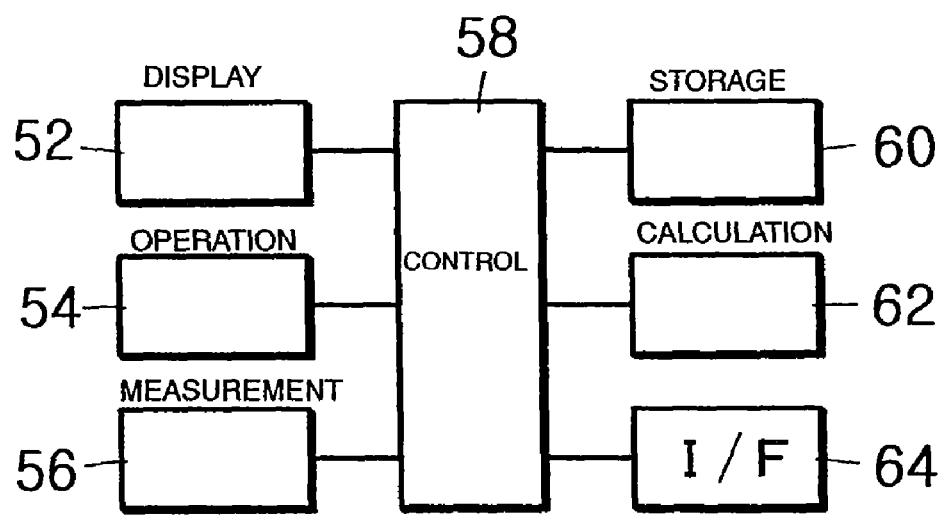
FIG. 4 is a block diagram of a measuring device.
Figure 5:
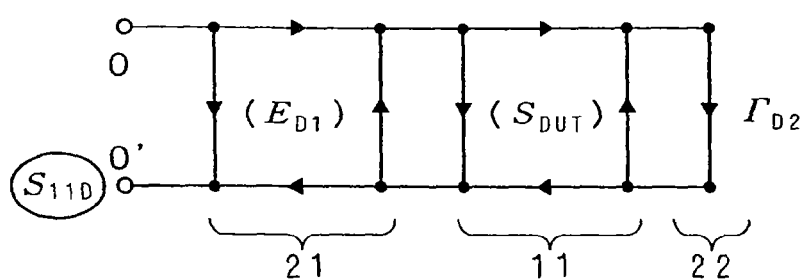
FIG. 5 consists of two-port circuit diagrams showing the fundamental principle of error correction of the present invention.
Figure 5:
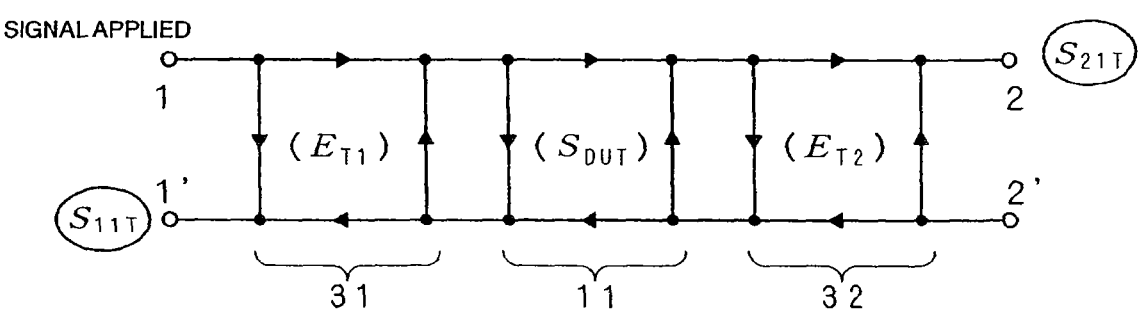

Next, the configurations of the measuring devices 36 and 86 capable of measuring the nonsignal line port are described with reference to the block diagram in FIG. 4.

The measuring devices 36 and 86 each include a display unit 52, an operation control 54, a measuring unit 56, a control unit 58, a storage unit 60, a computation unit 62, and an interface unit 64.

The display unit 52 includes a display panel and displays an operating status of the measuring device 38 or 86, operation instructions, etc. The operation control 54 includes a button and a switch, and receives an operation on the measuring device 36 or 86. The measuring unit 56 is connected to terminals of the electronic component 10 or 11 by the coaxial cables 35 or 85 and the test jig 30 or 80. The measuring unit 56 selects a terminal of the electronic component 10 or 11, if needed, inputs a signal, and measures an output signal. The control unit 58 manages overall control of the measuring device 36 or 86. The storage unit 60 stores programs for allowing the control unit 58 and the computation unit 62 to operate, measurement data from the measuring unit 56, calculation result data of the computation unit 62, etc. The computation unit 62 performs calculation in accordance with a predetermined program by using data from the measuring unit 56 and data stored in the storage unit 60. The interface unit 64 is an interface for exchanging data with an external apparatus, and performs input/output by receiving data and program to be stored in the storage unit 60, the calculation result data from the computation unit 62, etc.

The measuring devices 36 and 86 each operate in accordance with the program stored in the storage unit 60. The electronic component measuring devices 36 and 86 each can be allowed to operate in a plurality of operating modes including a calibration mode and a measurement mode.

In the calibration mode, data for correcting relative measurement errors between the reference jigs 20 and 70 and the test jigs 30 and 80 is obtained before a numerical expression for estimating electrical characteristics is determined. Specifically, the measuring unit 56 sequentially performs measurement in a state in which the sample for obtaining data and a through device (standard sample) are mounted on the reference jig 20 or 70 and on the test jig 30 or 80. At this time, an item to be measured is displayed on the display unit 52. On completion of preparation of the displayed item to be measured, an operator operates the operation control 54. When the operation control 54 receives this operation, the measuring unit 56 initiates measurement, and measured data is stored in the storage unit 60. The computation unit 62 reads the measured data stored in the storage unit 60 with appropriate timing, calculates the above-described correction adapter ($C1_{00}$, $C1_{01}$, $C1_{10}$, $C1_{11}$), $C2\Gamma$, etc., and determines a numerical expression for estimating electrical characteristics. The above-determined numerical expression is stored in the storage unit 60.

In the measurement mode, electrical characteristics in the case of using the test jig 30 or 80 to perform measurement are estimated from measured data obtained by using the test jig 30 or 80. In other words, the measuring unit 56 performs measurement in a state in which an arbitrary electronic component 10 or 11 is mounted on the test jig 30 or 80. The computation unit 62 calculates an estimated electrical characteristic value of the electronic component 10 or 11 from the measured data from the measuring unit 56. The calculated estimated value is displayed on the display unit 52 and is output from the interface unit 64 to an external apparatus.

By separately storing beforehand, in the storage unit 60, the determined numerical expression for estimating an electrical characteristic, and allowing the computation unit 62 to use the numerical expression, estimation of the electrical characteristic of the arbitrary electronic component 10 or 11 mounted on the test jig 30 or 80 can be performed, even if the calibration mode is omitted. In this case, a combination of the test jig 30 or 80 and the electronic component characteristic measuring device can be freely changed, thus enabling a flexible measuring operation.

Next, a disconnection detecting method using RF measurement is described.

Figure 31:
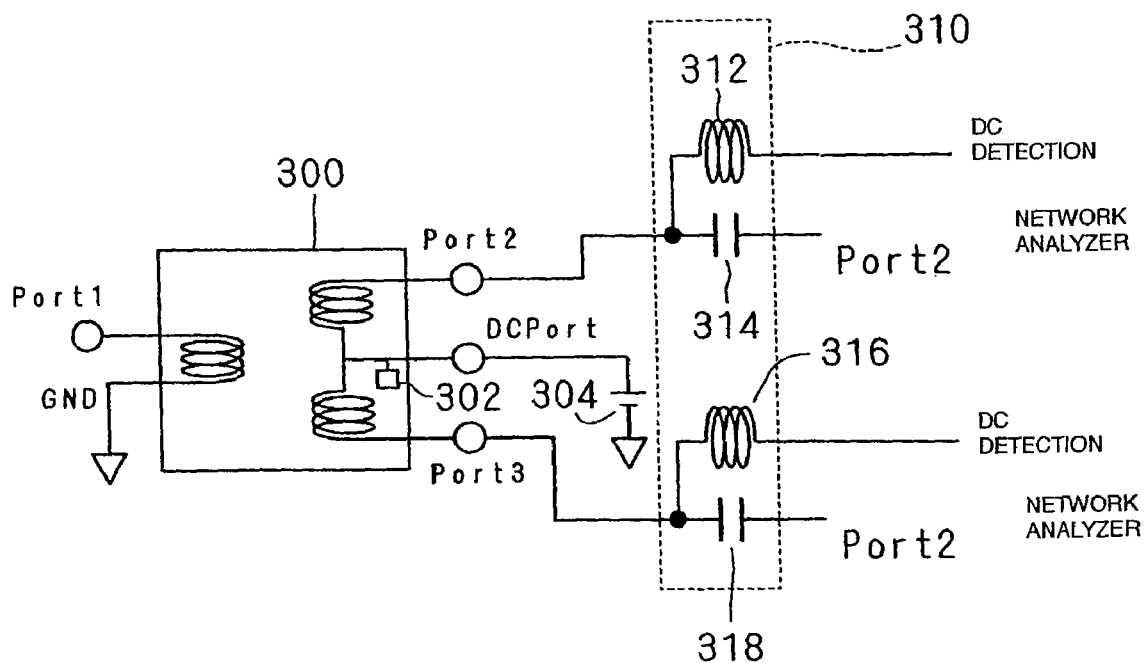
FIG. 31 is an electric circuit diagram showing a disconnection detecting method.
Figure 32:
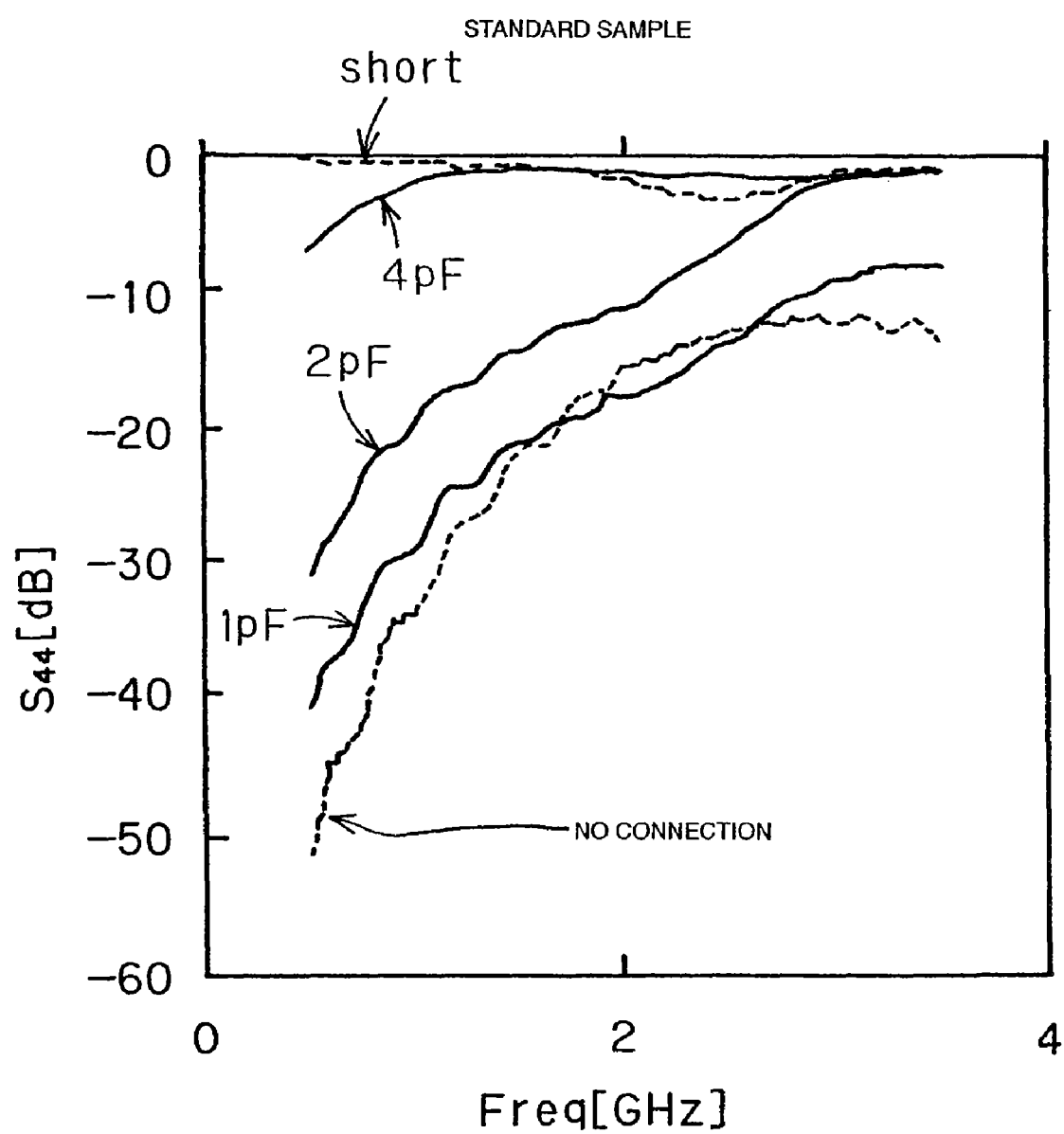
FIG. 32 is a graph showing a relationship between DC bypass capacitance and RF characteristics.

An electronic component having a built-in nonsignal line port (DC power supply port) is becoming mainstream as a checker of disconnection in active element's balance outputs (two ports), such as an LC chip bandpass filter using ceramic layers. In the disconnection detecting method, as shown in FIG. 31, by connecting a direct-current (DC) power supply 304 to a DC port of a DUT 300, connecting a bias T circuit 310 to each of balance output ports (ports 2 and 3), using inductors 312 and 316 and capacitors 314 and 318 to separate DC and RF signals, and detecting a DC output of the bias T circuit 310, a disconnection check of the balance output ports is performed. In addition, in order to eliminate an effect of the DC power supply 304 connected to the DC port, in the vicinity of the DUT 300, a bypass capacitor 302 having approximately 100 pF is connected to the DC port.

Currently, a user is given a guarantee with a jig (reference jig) including no DC port, and, in an actual process, a test jig using a DC port is used to perform measurement. In order to estimate a reference jig measurement from a test jig measurement, it is possible that, by measuring the DC port, the relative correction disclosed in Non-patent Document 1 or the like be applied. In this case, when using the prior art as it is, by performing RF measurement and correcting a test jig before connecting a power supply, a scattering error occurs in correction characteristic, and the capacitance of the DC port makes it difficult to perform the RF measurement itself, so that the reference jig and the test jig cannot be corrected. This is because the RF measurement is difficult since an RF signal from the DC port is totally reflected by a bypass capacitor without reaching a DUT, which is an effect of the bypass capacitance on a DC port line. The bypass capacitance of the DC port and a characteristic ($S_{44}$) of a Load resistor sample are as shown in, for example, FIG. 32. At a bypass capacitance of 4 pF, an RF characteristic of the Load resistor sample is identical in characteristic to a Short standard sample, so that it is difficult to perform standard sample measurement necessary for relative correction. In addition, for disconnection check, a DC power supply and a bias T circuit are also needed, and a management method for not only the system but also characteristic guarantee is complex.

Accordingly, by using a network analyzer to perform RF measurement, disconnection is inspected. On a test jig including a nonsignal line port (DC port), an RF connector is mounted on the DC port, and the network analyzer is set to be in a state capable of RF measurement. By outputting a low frequency (one point) RF signal from the DC port, with a device mounted on the test jig, and measuring a characteristic of transmission to balance output ports, disconnection and no disconnection are identified depending on the magnitude of a transmission characteristic level. However, it is preferable that the capacitance of a bypass capacitor connectable to the DC port be equal to or less than 2 pF in order to perform relative correction in a radio frequency range.

In order to perform correction between the reference jig and the test jig, RF measurement on the nonsignal line port is performed for the test jig. A DUT output disconnection check can be performed, with the test jig remaining corrected. In other words, with a test jig (including a nonsignal line port) capable of performing measurement in conditions equal to a to-user guaranteeing state having no nonsignal line port, in an environment identical to a test jig correcting environment, output port disconnection check can be performed without connecting the DC power supply. It is unnecessary to connect a disconnection checking power supply and the bias T to the test jig, thus enabling a disconnection check, with the correction environment of the test jig maintained. Accordingly, this enables a user guarantee of more accurate electrical characteristics.

By setting a disconnection checking RF signal to have a minimum frequency (for example, 300 KHz) of the network analyzer, the RF signal has a sufficiently low frequency for a guaranteed band of the device. Thus, measurement close to DC is possible, and only the need of one-point measurement only requires a short disconnection checking time, so that a tact down fault is prevented.

Only the network analyzer enables both signal line port measurement and an output disconnection check, and, since the need for the DC power supply and the bias T circuit is eliminated, a simple measurement system is formed, thus producing an economical effect.

In addition, bypass capacitor capacitance that is essential for the DC port is not needed, thus enabling appropriate correction between the reference jig and the test jig.

This disconnection checking method is generalized and described as follows.

A method for detecting disconnection inside an electronic component in a state capable of estimating, from measurement values of an electronic component for a test jig, an electrical characteristic of the electronic component obtained with the electronic component mounted on a reference jig, the method including:

a first step of inputting a low frequency RF signal from a DC port of the test jig to the electronic component;

a second step of measuring a transmission characteristic between the DC port and an output port; and a third step of performing disconnection detection at the output port by comparing the transmission characteristic and a threshold value.

According to the above method, by only using the network analyzer to perform output port disconnection detection without connecting the DC power supply and the bias T circuit, a state identical to the correction environment of the test jig is maintained, thus enabling accurate guaranteeing of electrical characteristics. In addition, simplicity of the measurement system and only the need for a short measurement time produce an economical effect.

It is preferable that the above electronic component disconnection detection be performed before electrical characteristic measurement in a state with the electronic component mounted on the test jig so that electrical characteristic measurement in a state with the electronic component mounted on the test jig becomes useless.

Next, an embodiment of the present invention is described.

Figure 9:
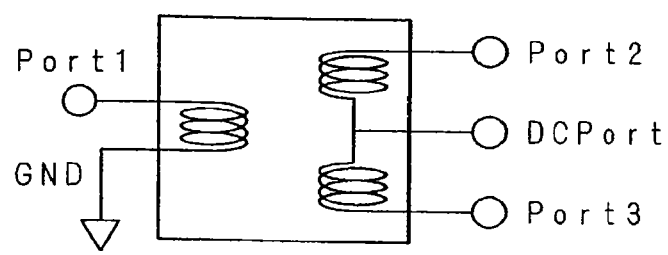
FIG. 9 is a circuit diagram of an electronic component having a nonsignal line port.

The unbalanced-input-to-balanced-output 2.4-GHz-band LC filter shown in FIG. 9 is used as the electronic component 10. This device includes ports 1-3 as signal line ports and a DC port as a nonsignal line port. Port 1 is an unbalanced input port, and Ports 2 and 3 are balanced output ports. The DC port is a port for connecting a multimeter in order to perform checking for direct current with the multimeter in a characteristic selection process in production. The DC port is open when it is used by a user since it is not used as a product.

As shown in FIG. 2b, the test jig 30 includes a coaxial connector 30d for connecting a multimeter to the DC port in addition to the coaxial connectors 30a, 30b, 30c, and 30d for connecting Ports 1 to 3 to the measuring device 36. In other words, signal line ports (Ports 1 to 3) and a nonsignal line port (the DC port) are measured.

In addition, in the reference jig 20, which enters the to-user guaranteeing state, the DC port is open. Accordingly, as shown in FIG. 2a, on the signal line ports (Ports 1 to 3) are measured and the nonsignal line port (the DC port) is not measured. This difference in nonsignal line port between the jigs 20 and 30 changes device measurements in the reference jig 30 and in the reference jig 20.

Specific experimental conditions are as follows:

DUT unbalanced-input-to-balanced-output 2.4-GHz-band LC filter

Measuring instrument ADVANTEST R3767CG (8-GHz 4-port network analyzer)

Frequency range 500 MHz to 3.5 GHz

Number of data items 801

IF bandwidth 1 kHz

Reference jig three-port jig without a DC port

Test jig four-port jig with an SMA connector attached to a DC port, a 3-dB attenuator attached to Port 1 (unbalanced input) and to Port 2 (balanced output), and a delay attached to Port 3 (balanced output)

Standard sample A standard sample that passes through between Ports 1 and 4 was prepared as a standard sample for the nonsignal line port. True values were unknown.

Details of evaluation $S_{DS21}$, $S_{SS22}$, $S_{DD22}$, $S_{CS21}$, $S_{21}/S_{31}$, and Phase Differential A simplified circuit diagram of the DUT is shown in FIG. 9.

Results of estimating reference jig measurements from test jig measurements by using the present invention are shown in FIGS. 10 to 13. In FIGS. 10 to 13, data in the case of using the technique in the present invention to derive the relative correction adapter of the nonsignal line port is labeled "Non-RF-port correction", and data in the case of using the technique in the related art to derive no relative correction adapter of the nonsignal line port is labeled "Non-RF-port ignored".

Figure 10:
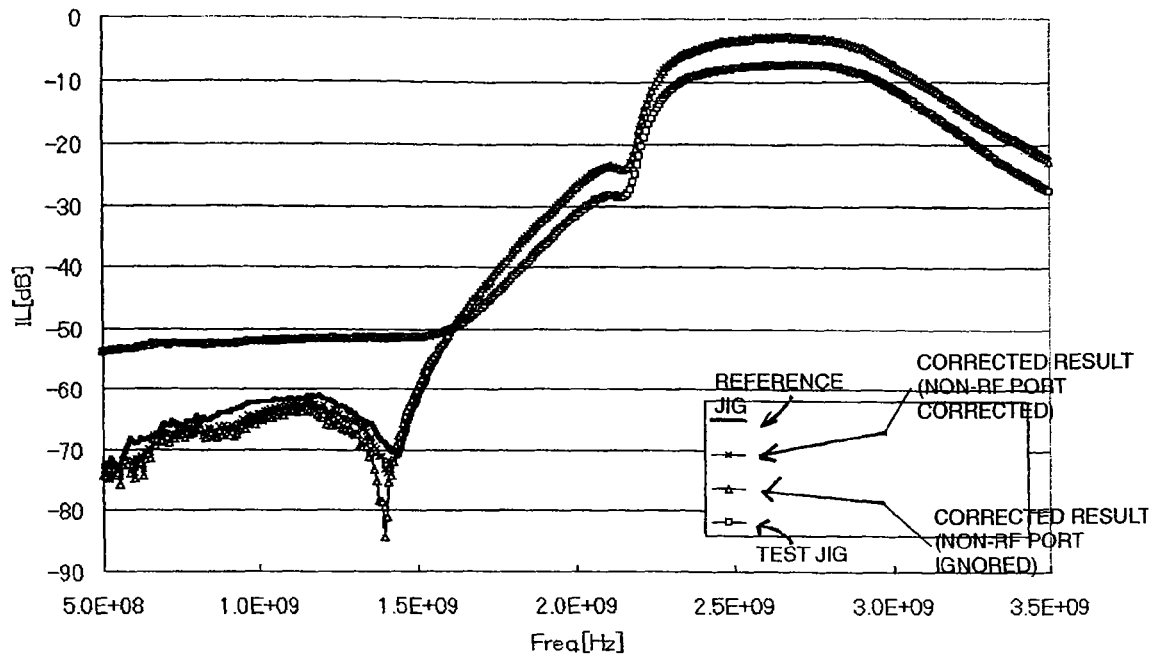
FIG. 10 consists of electrical characteristic graphs of the electronic component in FIG. 9.
Figure 10:
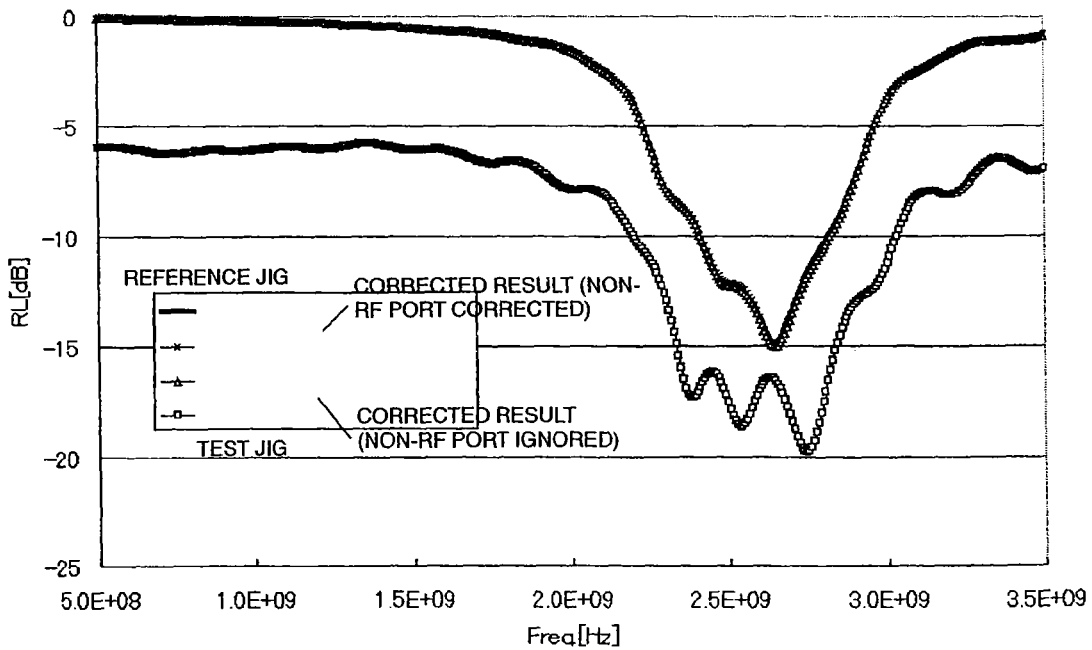
Figure 11:
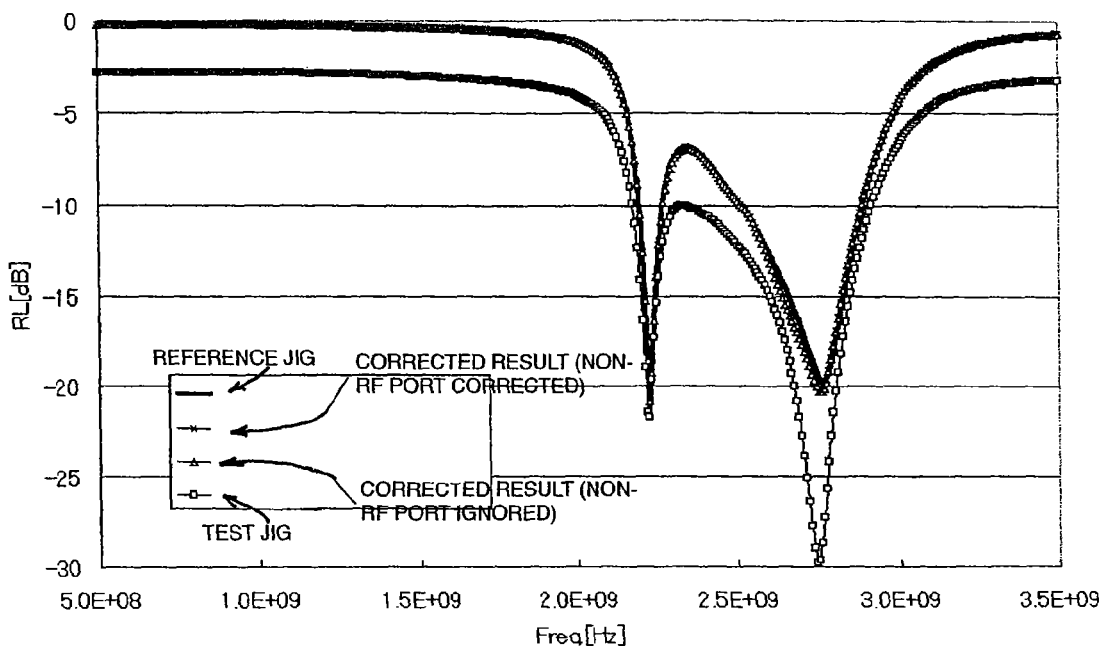
FIG. 11 consists of electrical characteristic graphs of the electronic component in FIG. 9.
Figure 11:
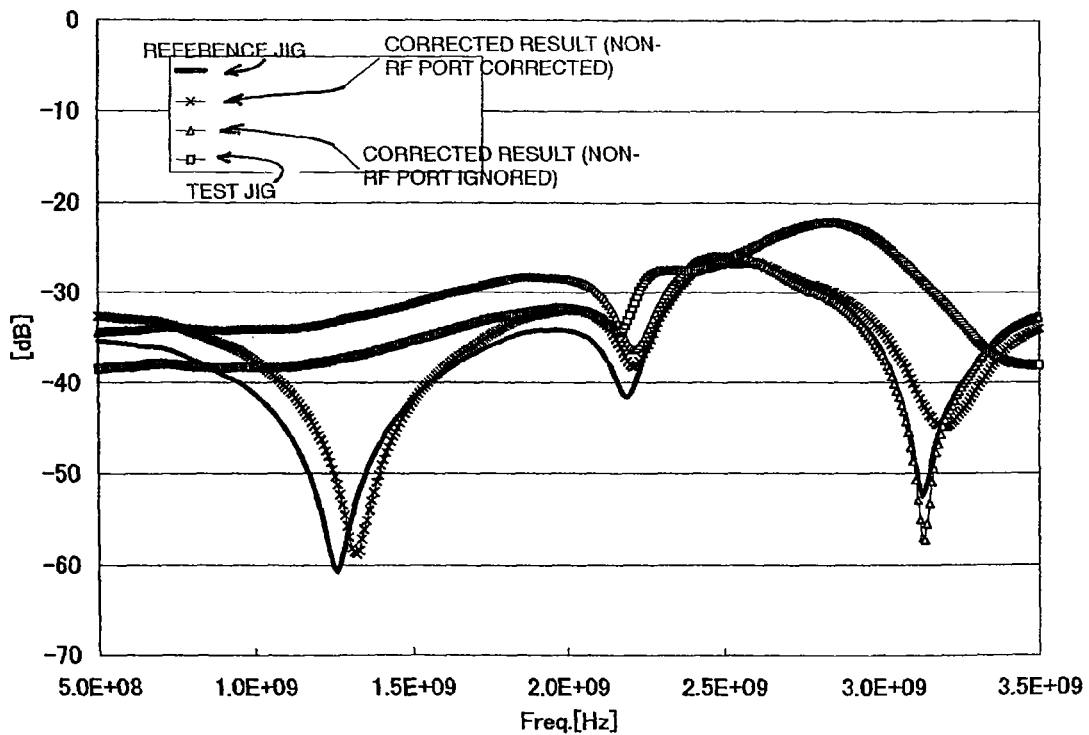

The use of a sample having good balancing in FIGS. 10 and 11 does not exhibit effects of the correction adapter of the nonsignal line port in $S_{DS21}$, $S_{SS22}$, and $S_{DD22}$.

Figure 12:
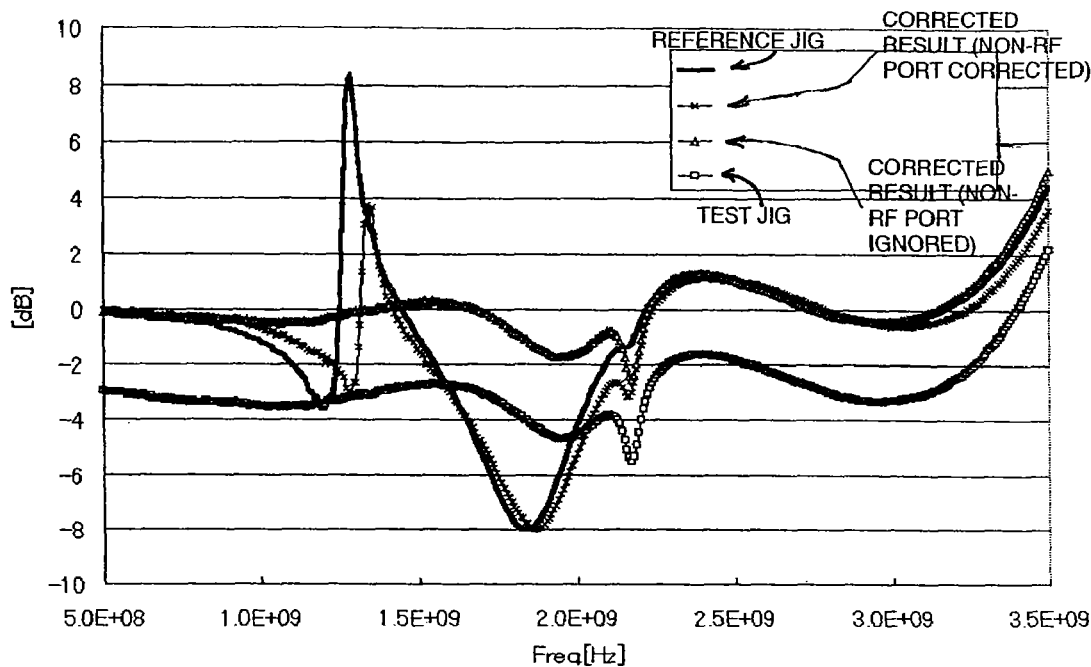
FIG. 12 consists of electrical characteristic graphs of the electronic component in FIG. 9.
Figure 12:
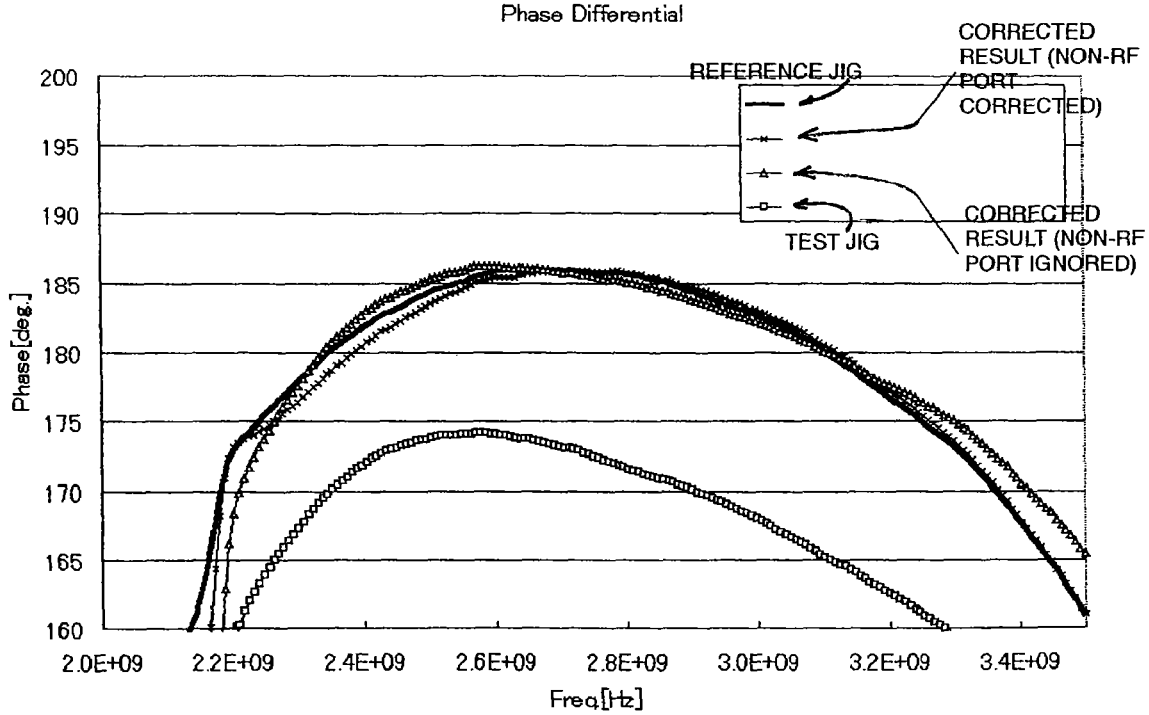
Figure 13:
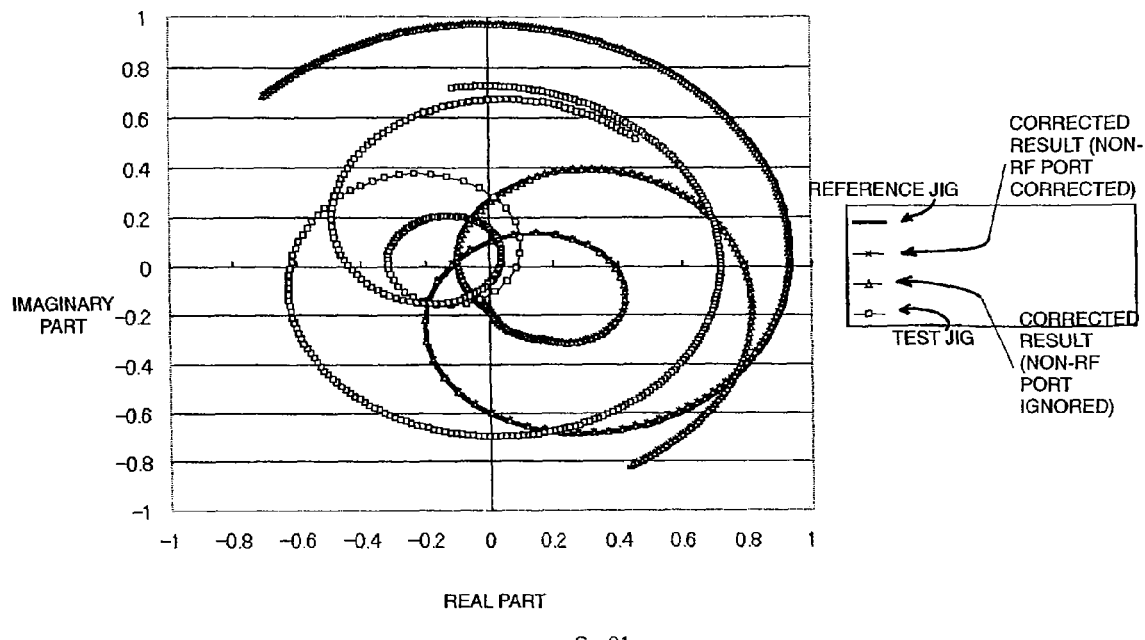
FIG. 13 consists of electrical characteristic graphs of the electronic component in FIG. 9.
Figure 13:
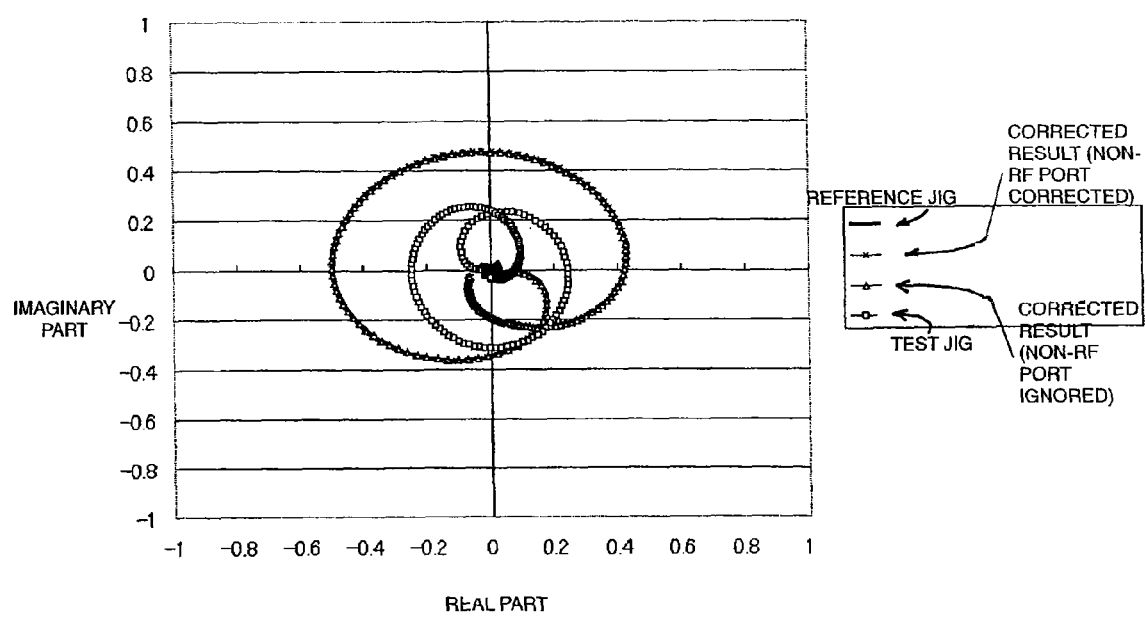

From FIGS. 11 and 12, in parameters $S_{CS21}$, $S_{21}/S_{31}$, and Phase Differential 1, which are greatly affected by a difference in balancing, the effects can be confirmed.

In $S_{CS21}$ and $S_{21}/S_{31}$, the effects can be confirmed in a low frequency side having no DUT balance, and, in Phase Differential 1, the effects can be confirmed also in a passband.

Figures 33, 34:
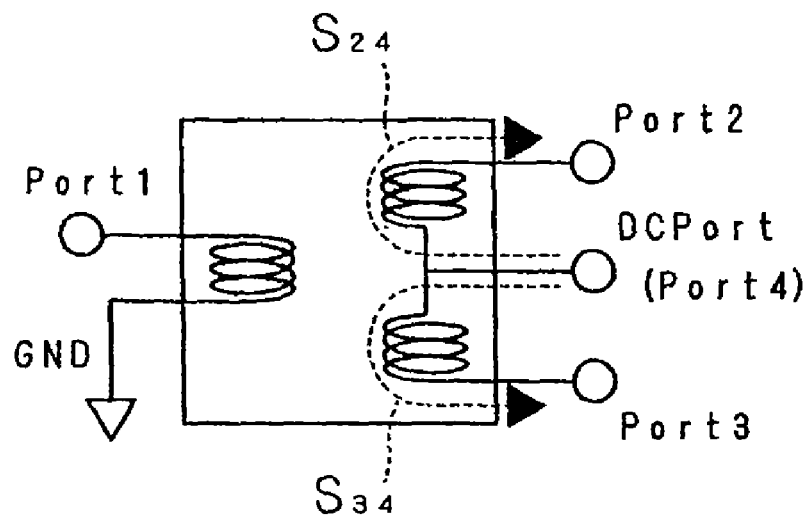
FIG. 33 is a circuit diagram of a case in which disconnection is measured.
FIG. 34 is a table of results of disconnection measurement.

In addition, for the DUT used in the description of the embodiment of the present invention, detection of disconnections between Ports 2 and 3 and the DC port (Port 4) was performed. For the purpose, the nonsignal line port (the DC port) was connected to Port 4 of the network analyzer in a test jig base state capable of estimating reference jig measurements from test jig measurements. At this time, it is preferable that the capacitance of the bypass capacitor connected to the DC port line be equal to or less than 2 pF. A measuring circuit is shown in FIG. 33. A frequency of 300 kHz was output from the DC port (Port 4), and characteristic ($S_{24}$, $S_{34}$) levels of transmission to the balanced output ports (Ports 2 and 3) were measured.

Results of measuring transmission characteristic levels of $S_{24}$ and $S_{34}$ when the output port 2 or 3 has a disconnection (bad item) and when the output port 2 or 3 has no disconnection (good item) are shown in FIG. 34. These results indicate that, obviously, the levels for disconnection and no disconnection have significance, and that, by setting a threshold value, if needed, output port disconnection can be detected by the network analyzer.

By handling the nonsignal line port (the DC port) as a signal line port without connecting a bypass capacitor and a power supply to the nonsignal line port, an output port disconnection check can be made possible, with the correction environment of the test jig maintained. The test RF signal of 300 kHz can be handled as substantial DC since it is sufficiently lower than the frequency band of 2.4 GHz of the device.

Second Embodiment

Electronic components of the "float type" including nonsignal line ports are described with reference to FIGS. 14 to 27.

Figure 14:
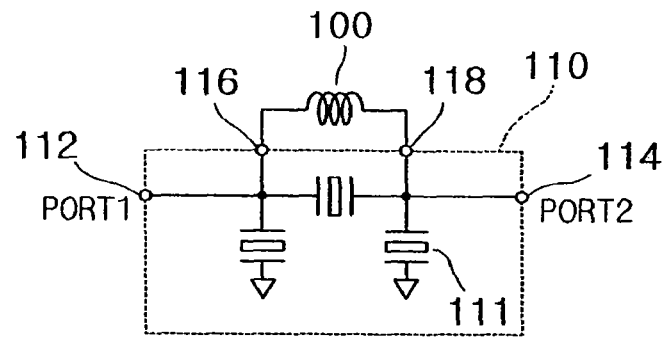
FIG. 14 is a circuit diagram of an electronic component of a "float type".

As shown in, for example, FIG. 14, an electronic component 110 includes not only signal line ports 112 and 114 (input/output Ports 1 and 2) but also two nonsignal line ports 116 and 118 to which an inductor 100 is connected in parallel. The electronic component 110 is used, with the inductor 100 connected thereto, in order to improve a characteristic (Q value) of a resonant circuit in which capacitors 111 are coupled in a π form.

Figure 15:
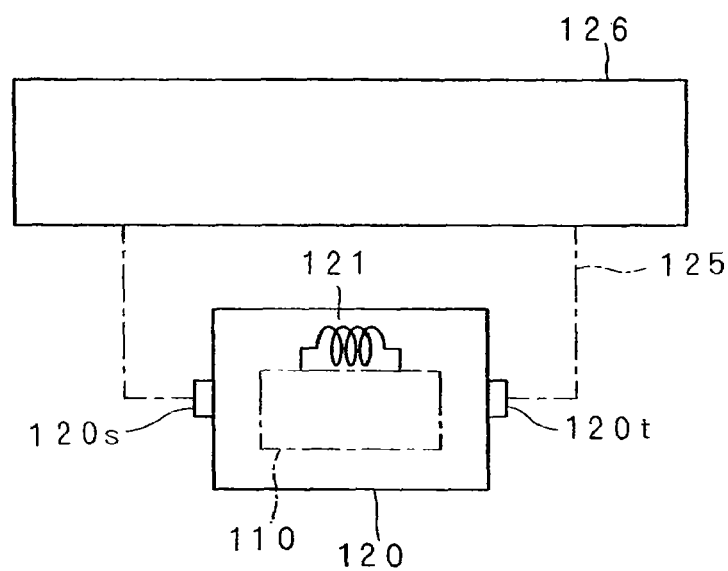
FIG. 15 consists of entire configuration illustrations of the cases of using (a) a reference jig and (b) a test jig for measurement.
Figure 15:
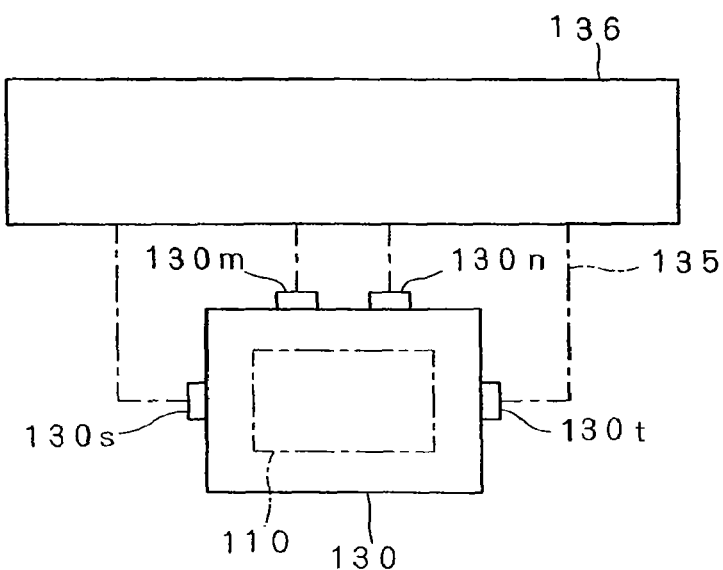

As shown in FIG. 15, similarly to the first embodiment, the electronic component 110 can be measured in states mounted on a reference jig 120 and on a test jig 130 by using measuring devices 126 and 136.

As shown in FIG. 15(a), the reference jig 120 includes coaxial connectors 120s and 120t connected to the signal line ports 112 and 114 of the electronic component 110, and an inductor 121 connected between nonsignal line ports 112 and 114 of the electronic component 110. Coaxial cables 125 are connected to the coaxial connectors 120s and 120t, and the signal line ports 112 and 114 of the electronic component 110 are measured by the measuring device 126.

As shown in FIG. 15(b), the test jig 130 includes coaxial connectors 130s and 130t connected to the signal line ports 112 and 114 of the electronic component 110, and coaxial connectors 130m and 130n connected to the nonsignal line ports 116 and 118 of the electronic component 110. Coaxial cables 135 are connected to the coaxial connectors 112, 124, 126, and 128, and the signal line ports 112 and 114, and nonsignal line ports 116 and 118 of the electronic component 110 are measured by the measuring device 136.

The measuring devices 126 and 136 are configured similarly to the measuring devices 26 and 36 in the first embodiment. Ends of the coaxial cables 125 and 135 connected to the measuring devices 126 and 136 are calibrated by using the standard instrument similarly to the first embodiment.

Next, the fundamental principle of estimating, from results of measurement with the electronic component 110 mounted on the test jig 130, electrical characteristics that will be obtained if measurement is performed, with the electronic component 110 mounted on the reference jig 120.

Figure 16:
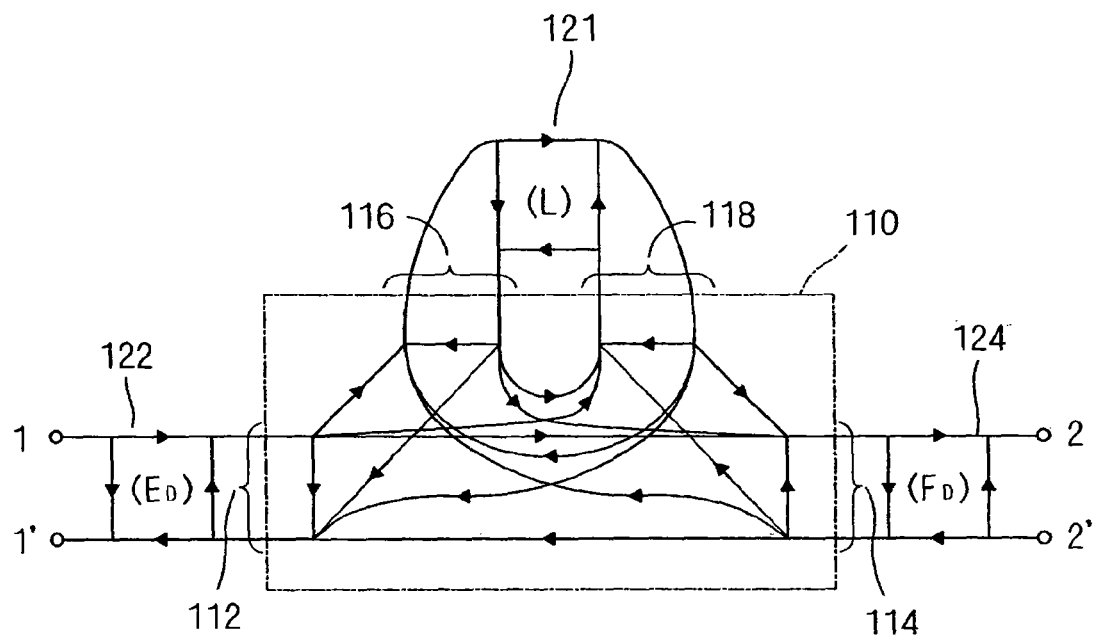
FIG. 16 is a single flow diagram of a case in which an electronic component is measured with it mounted on a reference jig.

FIG. 16 is a signal flow diagram in a case in which the electronic component 110 is mounted on the reference jig 120, as shown in FIG. 15(a). Terminal pairs 11' and 22' correspond to the coaxial connectors 120s and 120t (coaxial connector connection portions in which calibration of the measuring device 126 is performed at an end of the coaxial cable 125) of the reference jig 120. Electrical characteristics of portions 122 and 124 between the coaxial connectors 120s and 120t of the reference jig 120 and both signal line ports 112 and 114 of the electronic component 110 are represented by $(E_D)$ and $(F_D)$, respectively. An electrical characteristic of both nonsignal line ports 116 and 118 to which the inductor 121 is connected is represented by (L).

Figure 17:
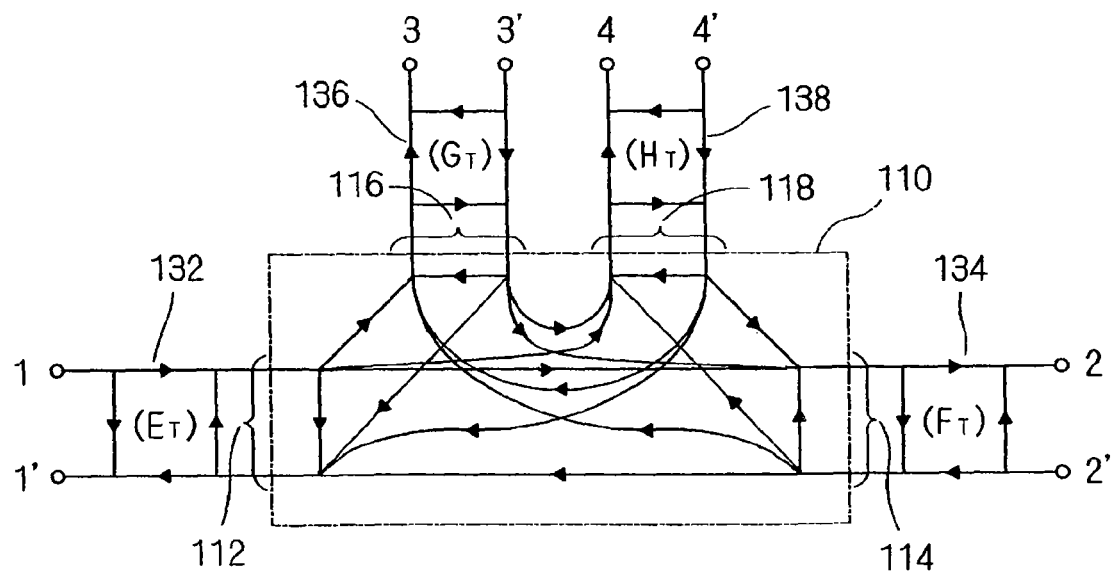
FIG. 17 is a single flow diagram of a case in which an electronic component is measured with it mounted on a test jig.

FIG. 17 is a signal flow diagram in a case in the electronic component 110 is mounted on the test jig 130, as shown in FIG. 15(b). Terminal pairs 11', 22', 33', and 44' correspond to coaxial connectors 130a, 130b, 130c, and 130d (coaxial connector connection portions in which calibration of the measuring device 136 is performed at an end of the coaxial cable 135) of the test jig 130. The portions 132 and 134 between both nonsignal line ports 116 and 118 of the electronic component 110 and the coaxial connectors 130m and 130n of the test jig 130 are represented by $(G_T)$ and $(H_T)$, respectively.

Figure 18:
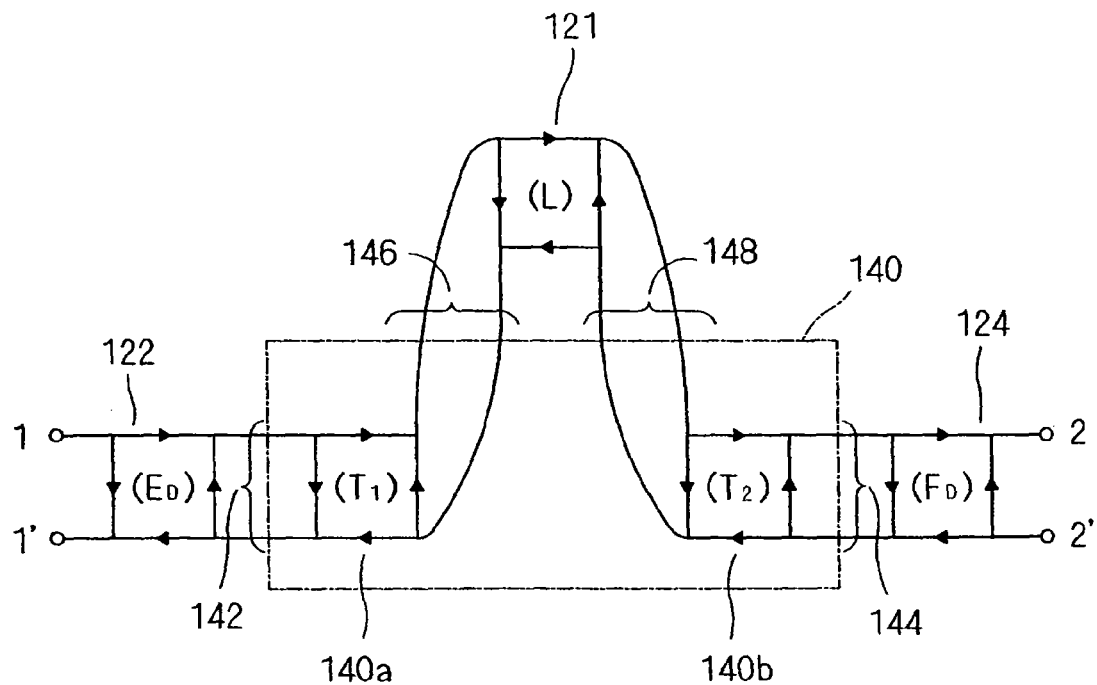
FIG. 18 is a single flow diagram of a case in which measurement is performed, with a through device mounted on a reference jig.

FIG. 18 is a signal flow diagram in a case in which the through device 140 is mounted on the reference jig 120. The through device 140 includes ports 142, 144, 146, and 148 corresponding to the ports 112, 114, 116, and 118 of the electronic component 110, and electrical connection is established between the ports 142 and 144, which correspond to signal line ports, and between the ports 146 and 148, which correspond to nonsignal line ports. In addition, an electrical characteristic of a portion 140a between the ports 142 and 146 is represented by $(T_1)$, and an electrical characteristic of a portion 140b between the other ports 144 and 148 is represented by $(T_2)$.

The value measured with the through device 140 mounted on the reference jig 120 can be represented by the following expression (4) if the reference numerals in FIG. 18 represent transmission parameter matrices.

$$(D_{thru})=(E_D)\cdot(T_1)\cdot(L)\cdot(T_2)\cdot(F_D) \tag{4}$$

Figure 19:
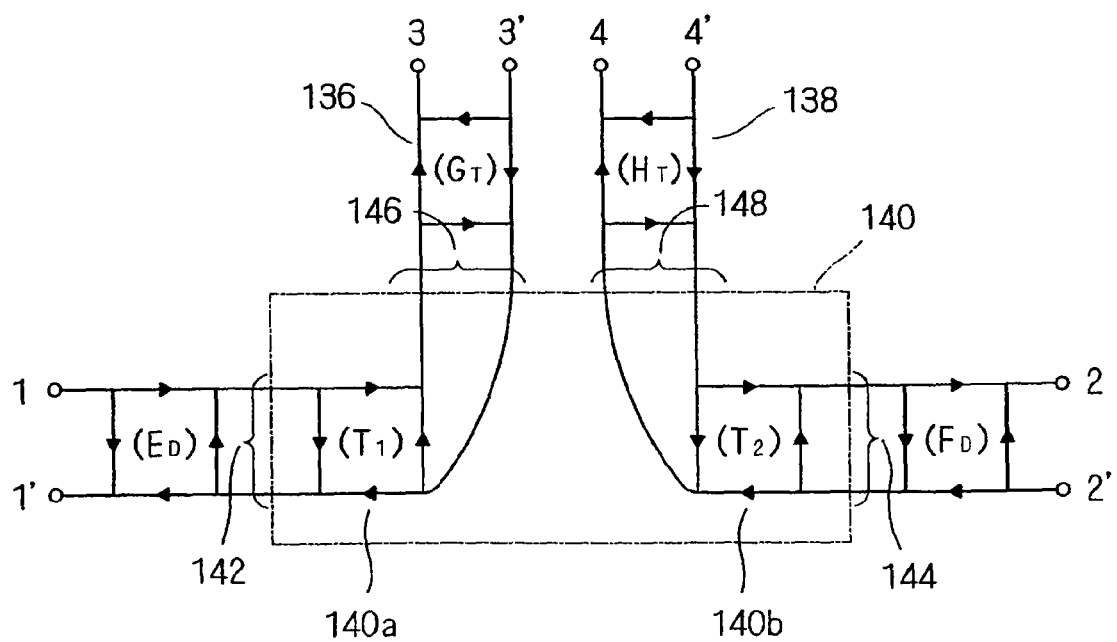
FIG. 19 is a single flow diagram of a case in which, after signal-line-port relative correction, measurement is performed, with a through device mounted on a test jig.

FIG. 19 is a signal flow diagram in a case in which the through device 140 is mounted on the test jig 130. Here, for brevity of description, by using the above-described relative correction adapter concerning the signal line ports, error factors of ports 1 and 2 of the test jig 130 are corrected into error factors $(E_D)$ and $(F_D)$ of the reference jig 120. In other words, the terminal pairs 11' and 22' correspond to the coaxial connectors 120s and 120t of the reference jig 120.

A value measured with the through device 140 mounted on the test jig 130 can be represented by the following expression (5) concerning between the terminal pairs 11'-33' if the reference numerals in FIG. 19 represent transmission parameter matrices.

$$(T1_{thru})=(E_D)\cdot(T_1)\cdot(G_T) \tag{5}$$

In addition, a value between the terminal pairs 22'-44' can be represented by the following expression (6).

$$(T2_{thru})=(H_T)\cdot(T_2)\cdot(F_D) \tag{6}$$

Figure 20:
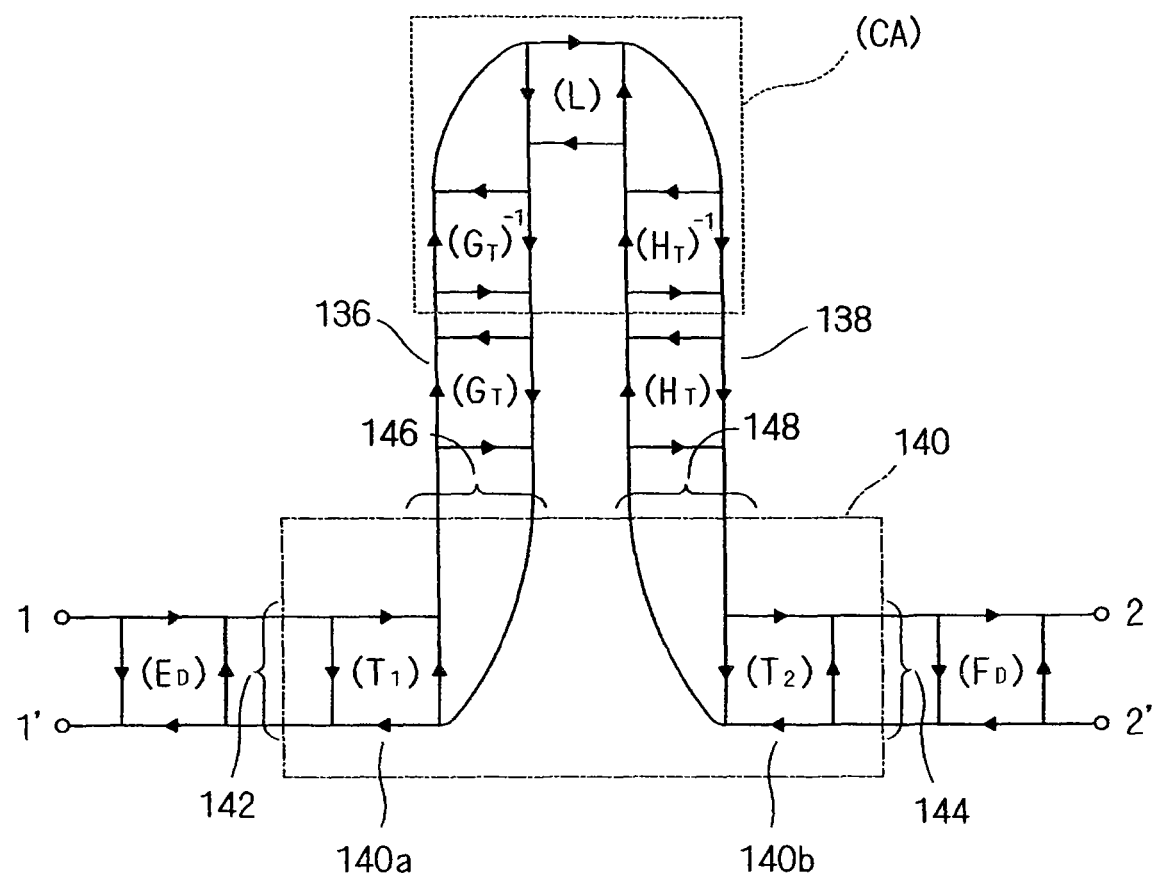
FIG. 20 is a single flow diagram obtained when a relative correction adapter is assumed.

A case in which, as shown in FIG. 20, adapters $(G_T)^{-1}$ and $(H_T)^{-1}$ for neutralizing error characteristics $(G_T)$ and $(H_T)$ are connected to the terminal pairs 33' and 44', with the inductor 121 connected thereto, is discussed. This case is equivalent to the state, shown in FIG. 18, with the through device 140 mounted on the reference jig 120. If the relative correction adapter between the nonsignal line ports of the reference jig 120 is represented by (CA), the following expressions hold.

$$(CA)=(G_T)^{-1}\cdot(L)\cdot(H_T)^{-1} \tag{7}$$

$$(D_{thru})=(T1_{thru})\cdot(CA)\cdot(T2_{thru}) \tag{8}$$

Multiplication of both sides of expression (8) by inverse matrices $(T1_{thru})^{-1}$ and $(T2_{thru})^{-1}$ from either side produces $$(CA)=(T1_{thru})^{-1}\cdot(D_{thru})\cdot(T2_{thru})^{-1} \tag{9}$$

By substituting expressions (4) to (6) for expression (9), $$(CA) = \{(E_D)\cdot(T_1)\cdot(G_T)\}^{-1}\cdot\{(E_D)\cdot(T_1)\cdot(L)\cdot(T_2)\cdot(F_D)\}\cdot\{(H_T)\cdot(T_2)\cdot(F_D)\}^{-1} \quad (10)$$
$$= (G_T)^{-1}\cdot(T_1)^{-1}\cdot(E_D)^{-1}\cdot(E_D)\cdot(T_1)\cdot(L)\cdot(T_2)\cdot(F_D)\cdot(F_D)^{-1}\cdot(T_2)^{-1}\cdot(H_T)^{-1}$$

$$\downarrow \boxed{\begin{array}{c}(F_D\cdot(F_D)^{-1}\\ \rightarrow(F_D)\cdot(F_D)^{-1}\end{array}}$$

$$= (G_T)^{-1}\cdot(L)\cdot(H_T)^{-1}$$

This is equal to expression (7).

Figure 21:
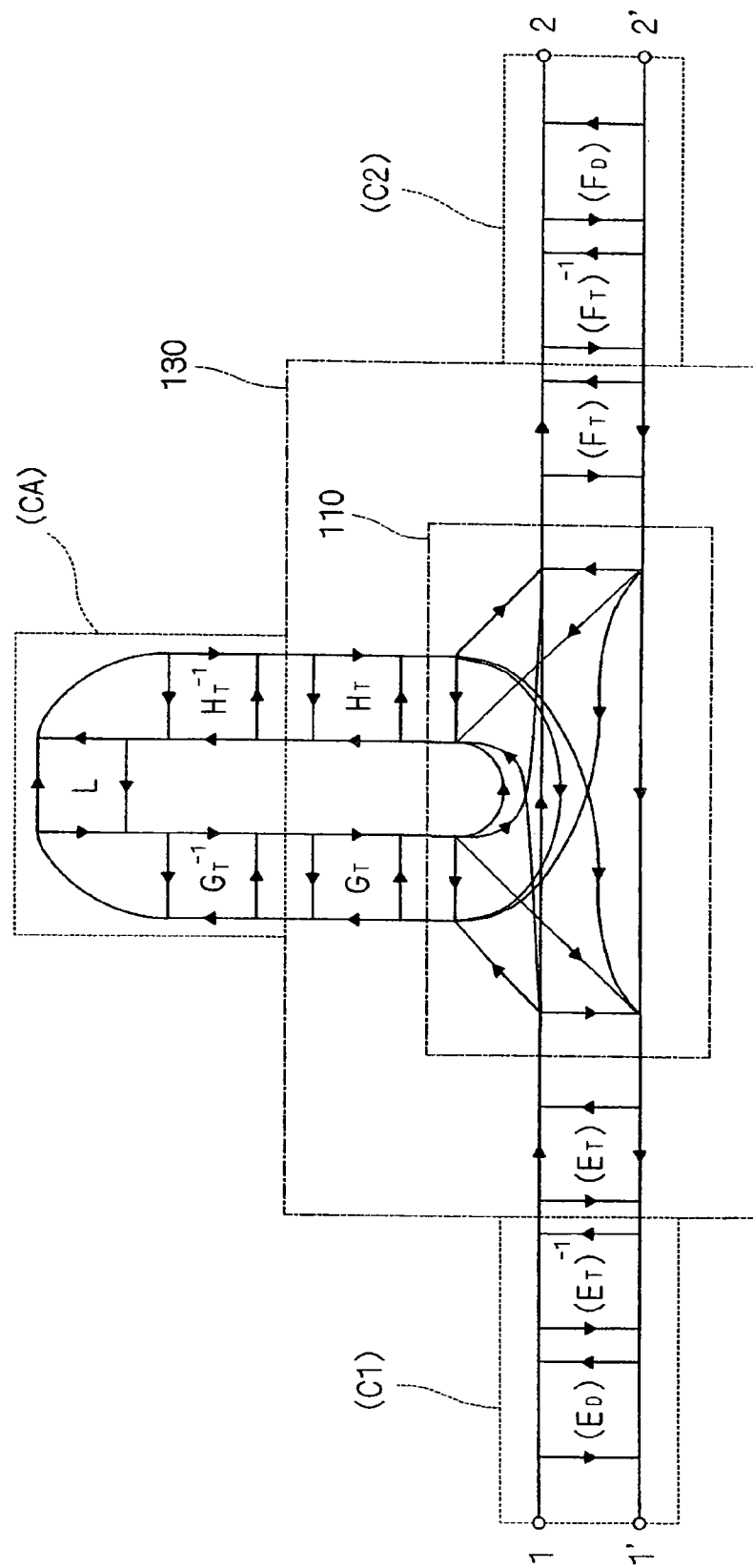
FIG. 21 s a single flow diagram obtained when a relative correction adapter is assumed.
Figure 22:
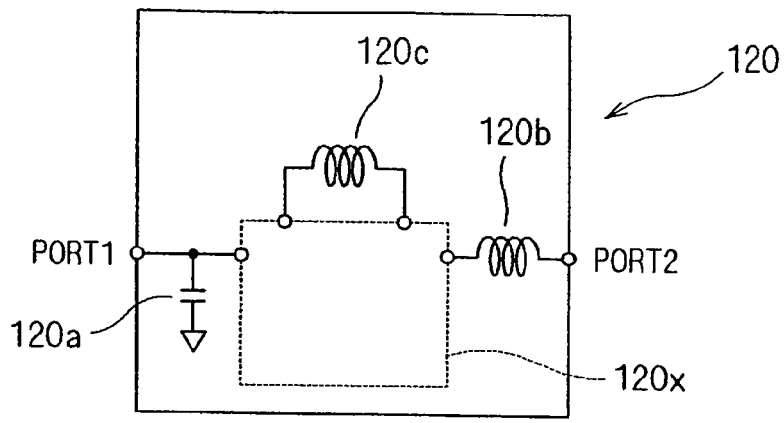
FIG. 22 consists of circuit diagrams of (a) a reference jig and (b) a test jig.
Figure 22:
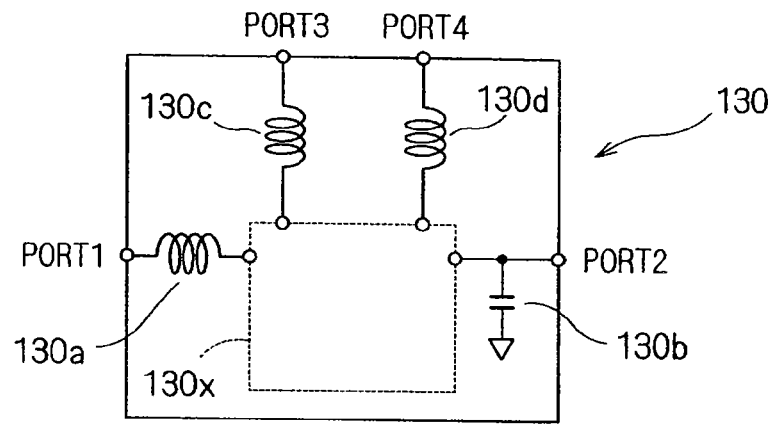
Figure 23:
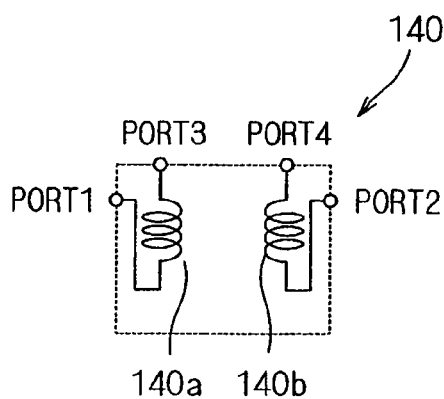
FIG. 23 consists of circuit diagrams of (a) a through device and (b) an item to be tested.
Figure 23:
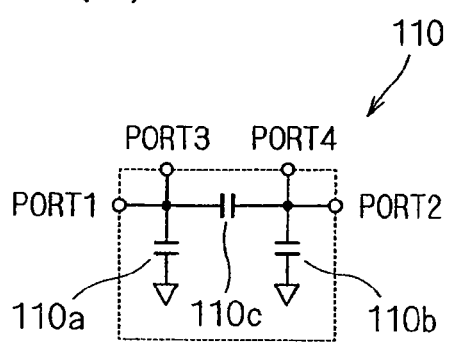

In other words, by finding the relative correction adapters (C1) and (C2) shown in FIG. 21 for the signal line ports beforehand, and, for the nonsignal line ports, using ($D_{thru}$) obtained by performing measurement with the through device 140 mounted on the reference jig 120 and ($T1_{thru}$) and ($T2_{thru}$) obtained by performing measurement with the through device 140 mounted on the test jig 130, the relative correction adapter (CA) for the nonsignal line ports can be determined.

By performing measurement with the arbitrary electronic component 110 mounted on the test jig 130, as shown in FIG. 21, values in boundaries between the test jig 130 and relative correction adapters (C1), (C2), and (CA) are obtained. If the values of relative correction adapters (C1), (C2), and (CA) are determined, the terminal pairs 11' and 22' corresponding to the coaxial connectors 120s and 120t of the reference jig 120 can be calculated. In other words, from results of measurement performed with the arbitrary electronic component 110 mounted on the test jig 130, an estimated electrical characteristic value of the electronic component 110 that will be obtained if the electronic component 110 is mounted on the reference jig 120 can be calculated.

Next, numerical analysis is shown as an embodiment of the above-described method.

FIG. 22(a) is an electric circuit diagram assuming error factors concerning the reference jig 120. The values of the elements 120a to 120c with respect to a sample mount portion 120x were designed as follows:
capacitor 120a: 0.1 pF;
inductor 120b: 0.1 nH; and
inductor 120c: 1.0 nH.

FIG. 22(b) is an electric circuit diagram assuming error factors concerning the test jig 130. The values of the elements 130a to 130c with respect to a sample mount portion 130x were designed as follows:
inductor 130a: 0.2 nH;
capacitor 130b: 0.2 pF;
inductor 130c: 0.1 nH; and
inductor 130d: 0.1 nH.

FIG. 23(a) is an electric circuit diagram of the through device 140 for use in calculating the relative correction adapters for the nonsignal line ports. Inductors 140a and 140b are connected between ports 1 and 3 and between ports 2 and 4, respectively.

The set values are as follows:
inductor 140a: 0.05 nH; and
inductor 140b: 0.075 nH.

FIG. 23(b) is an electric circuit diagram of the electronic component 110 whose electrical characteristic is mounted. Capacitors 110a to 110c constitute a π-form resonator. The set values are as follows:
capacitor 110a: 0.3 pF;
capacitor 110b: 0.3 pF; and
capacitor 110c: 0.2 pF.

Regarding the case of performing measurement with the through device 140 and the electronic component 110 mounted on the reference jig 120 and the test jig 130, which have the values described above, electrical characteristics were calculated with a measurement frequency as 10 GHz.

Figure 24:
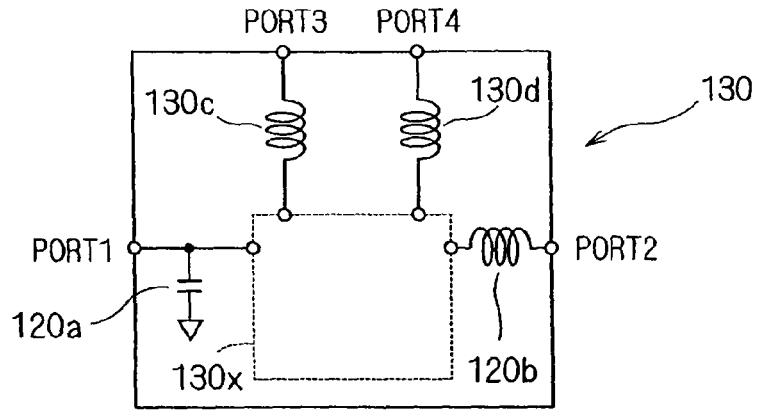
FIG. 24 is a circuit diagram of a test jig after signal-line-port relative correction.
Figure 25:
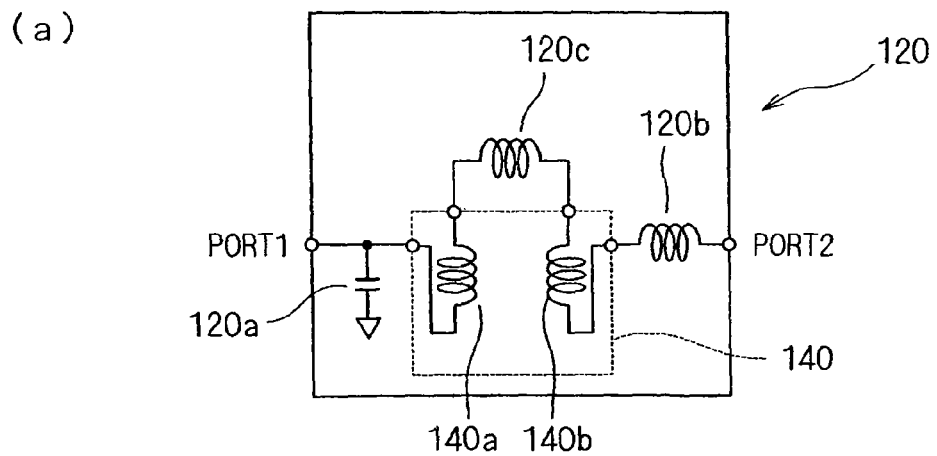
FIG. 25 consists of circuit diagrams of a case in which a through device is measured after signal-line-port relative correction.
Figure 25:
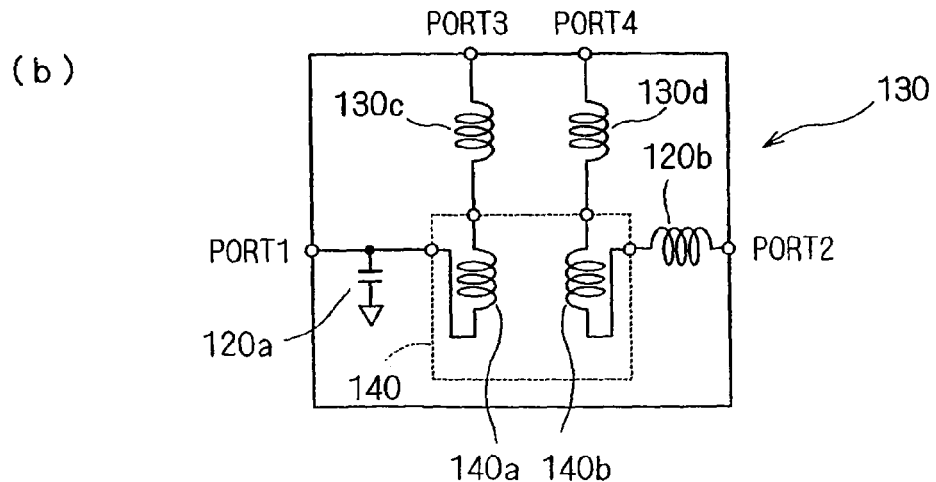
Figure 26:
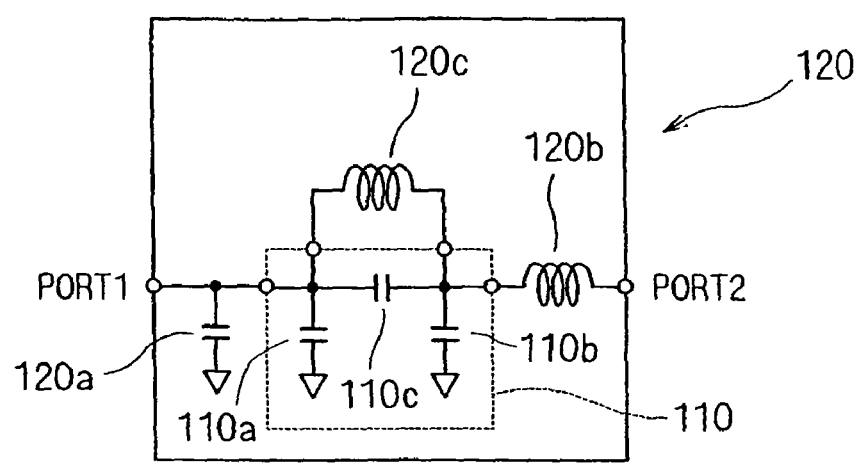
FIG. 26 consists of circuit diagrams of cases in which an item to be tested is measured.
Figure 26:
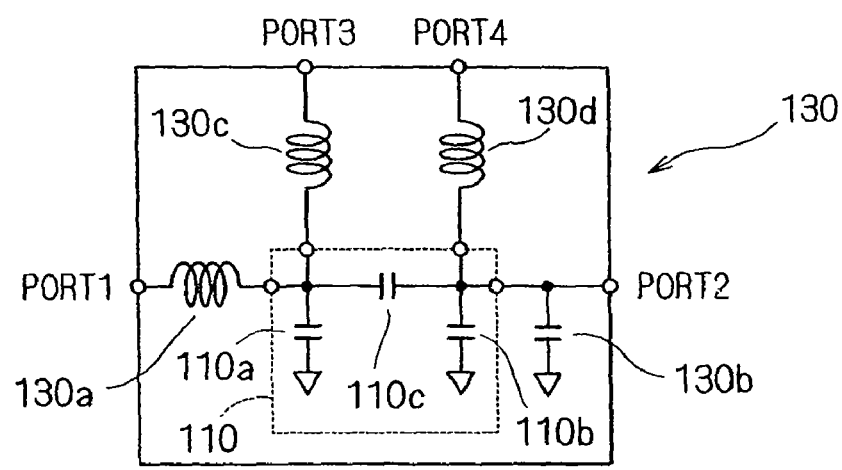

First, regarding the relative correction adapters for ports 1 and 2, the measurements with the test jig 130 are converted into values measured in the state shown in FIG. 24. In other words, measurements in a case in which ports 1 (130s) and 2 (130t) of the test jig 130 are replaced by ports 1 (120s) and 2 (120t) of the reference jig 120 are obtained.

Next, the through device 140 is measured with both the reference jig 120 and the test jig 130. Among measurement results with the test jig 130, those of ports 1 and 2 are relatively corrected. This produces measurement results in the state in FIG. 25. Although the transmission parameter matrices are used in the description of the fundamental principle, the results are represented by scattering parameter matrices for intuitive ease of understanding. When a scattering parameter matrix between ports 1 and 2 of the reference jig 120 is represented by ($S_{thru}$), a scattering parameter matrix between ports 1 and 3 of the test jig 130 is represented by ($S1_{thru}$) and a scattering parameter matrix is represented by ($S2_{thru}$), measurements in the states are as follows:

$$S_{thru} = \begin{bmatrix} 0.524 & 0.168i & 0.529 & -0.646i \\ 0.529 & -0.646i & 0.268 & 0.480i \end{bmatrix} \quad [\text{Expression 7}]$$

$$S1_{thru} = \begin{bmatrix} 0.013 & -0.068i & 0.966 & -0.250i \\ 0.966 & -0.250i & -0.044 & -0.053i \end{bmatrix} \quad [\text{Expression 8a}]$$

$$S2_{thru} = \begin{bmatrix} 0.053 & 0.223i & 0.947 & -0.223i \\ 0.947 & -0.223i & 0.053 & 0.223i \end{bmatrix} \quad [\text{Expression 8b}]$$

From the above results, by using expression (7), the relative correction adapter (CA) between nonsignal line ports in the "float type" is represented in the form of a scattering parameter matrix (SA), as follows:

$$SA = \begin{bmatrix} 0.162 & 0.369i & 0.838 & 0.369i \\ 0.838 & 0.369i & 0.162 & 0.369i \end{bmatrix} \quad [\text{Expression 9}]$$

By using the relative correction adapter obtained as described above, from the measurements in the state with the electronic component 110 mounted on the test jig 130, measurements in the state with the electronic component 110 mounted on the reference jig 120 are estimated. FIG. 26(b) shows a state of measurement with the electronic component 110 mounted on the test jig 130. By performing relative correction of ports 1 and 2 on results of the measurement, the following scattering parameter matrix is obtained.

$$\begin{bmatrix} -0.418 & -0.455i & 0.198 & 0.044i & 0.516 & -0.520i & 0.197 & 0.020i \\ 0.198 & 0.044i & -0.348 & -0.331i & 0.200 & 0.019i & 0.534 & -0.635i \\ 0.516 & -0.520i & 0.200 & 0.019i & -0.525 & -0.329i & 0.196 & -0.005i \\ 0.197 & 0.020i & 0.534 & -0.635i & 0.196 & -0.005i & -0.438 & -0.206i \end{bmatrix} \quad \text{[Expression 10]}$$

A result of calculating a state with the float relative correction adapter in (Expression 9) is as follows:

[Expression 11]

$$\begin{bmatrix} -0.072 & -0.979i & -0.190 & -0.009i \\ -0.190 & -0.009i & 0.168 & -0.967i \end{bmatrix} \quad (11)$$

This scattering parameter matrix is an estimated measurement in a case of measurement with the electronic component 110 mounted on the reference jig 120.

Next, as shown in FIG. 26(a), calculation for a case of measurement with the same electronic component 110 connected to the reference jig 120 produces the following scattering parameter matrix.

[Expression 12]

$$\begin{bmatrix} -0.072 & -0.979i & -0.190 & -0.009i \\ -0.190 & -0.009i & 0.168 & -0.967i \end{bmatrix} \quad (12)$$

The comparison between the above expressions (11) and (12) indicates that the estimated value and the measurement are completely equal to each other. Accordingly, it can be confirmed that the relative correction method is also applicable to an electronic component of the float type.

Figure 27:
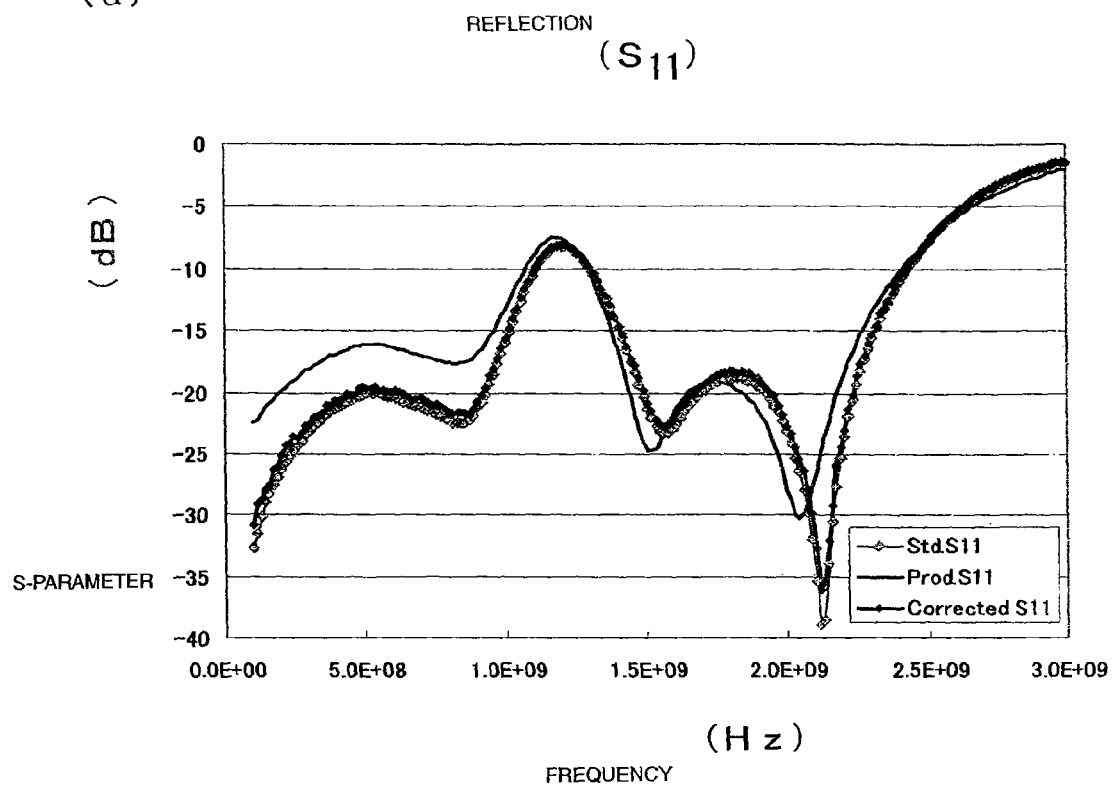
FIG. 27 consists of electrical characteristic graphs of electronic components.
Figure 27:
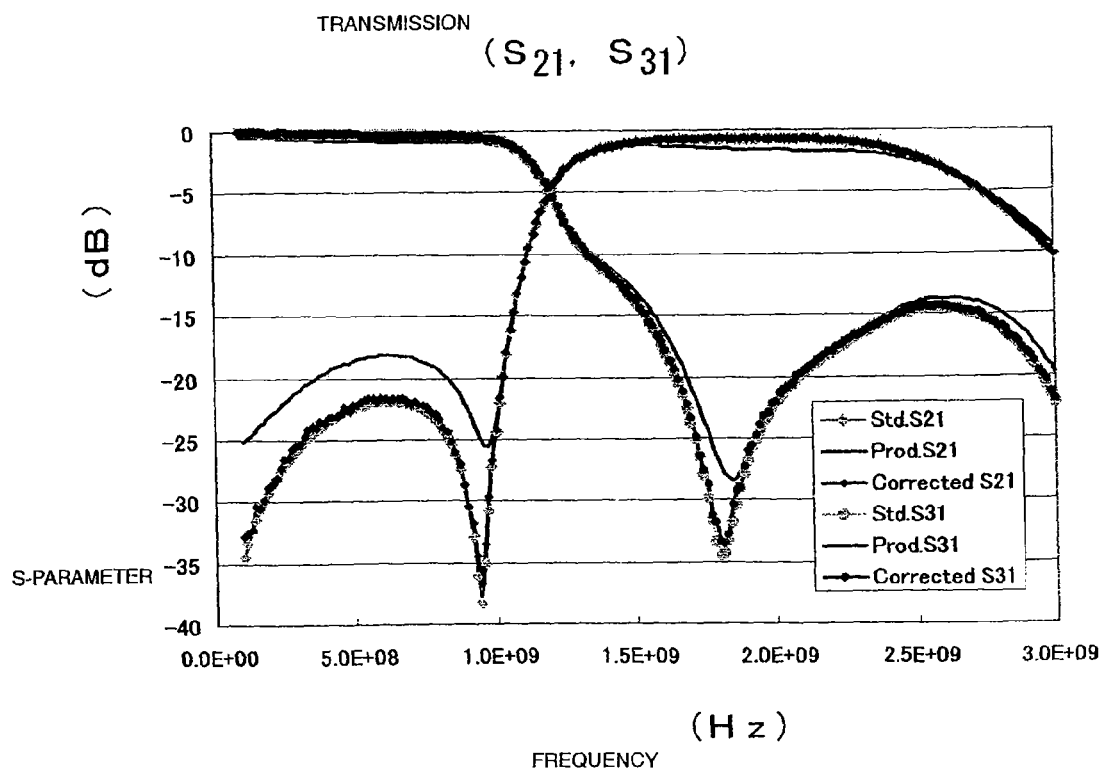

Next, regarding a duplexer sample, graphs of measurements of its electrical characteristic and estimated values by the relative correction method in the second embodiment are shown in FIG. 27. Each graph shows values (Prod.) measured with the duplexer sample mounted on a test jig, values (Std.) measured with the sample mounted on a reference jig, and estimated characteristic values (Corrected.) calculated from the values measured with the sample mounted on the test jig, the characteristic values being obtained with the sample mounted on the reference jig. FIG. 27(a) shows parameter $S_{11}$ representing a reflection characteristic of the duplexer. FIG. 27(b) shows parameters $S_{21}$ and $S_{31}$ representing transmission characteristics.

In FIG. 27, regarding both the reflection characteristic and the transmission characteristic, the estimated values (Corrected.) are substantially equal to the actual measurements (Prod.). Accordingly, also in the "float type", an effect of the relative correction can be confirmed.

As described above, regarding a device including a nonsignal line port, in a to-user guaranteeing state, the nonsignal line port must be guaranteed in characteristic by estimating a state of use by a user. Thus, RF measurement on the nonsignal line port for a reference jig is impossible. Accordingly, there is a need of a technique for estimating measurements for a reference jig in which nonsignal-line-port RF measurement cannot be performed from a test jig in which nonsignal-line-port RF measurement is possible. The present invention satisfies this need.

According to the present invention, device characteristics in a condition equal to a to-user guaranteeing state can be estimated, thus enabling more accurate guaranteeing of electrical characteristics, so that an advantage, such as good item improvement, is obtained. In addition, since a relative error between jigs is measured and corrected, jig adjustment is not necessary at all. Thus, the present invention is applicable to a case in which the device has a broad bandwidth without raising a problem.

The present invention is applicable to commercial module products (the entirety of active elements including power-supply lines, devices in which change in parameter of externally attached components control operating ranges) of the "shunt type" including nonsignal line ports, and, in addition, to radio frequency devices (such as filters and duplexers) of the "float type" including nonsignal line ports.

Furthermore, by combining the above-described fundamental principles, the present invention can be also applied to electronic components that are hybrids of the "shunt type" and the "float type".

Figure 28:
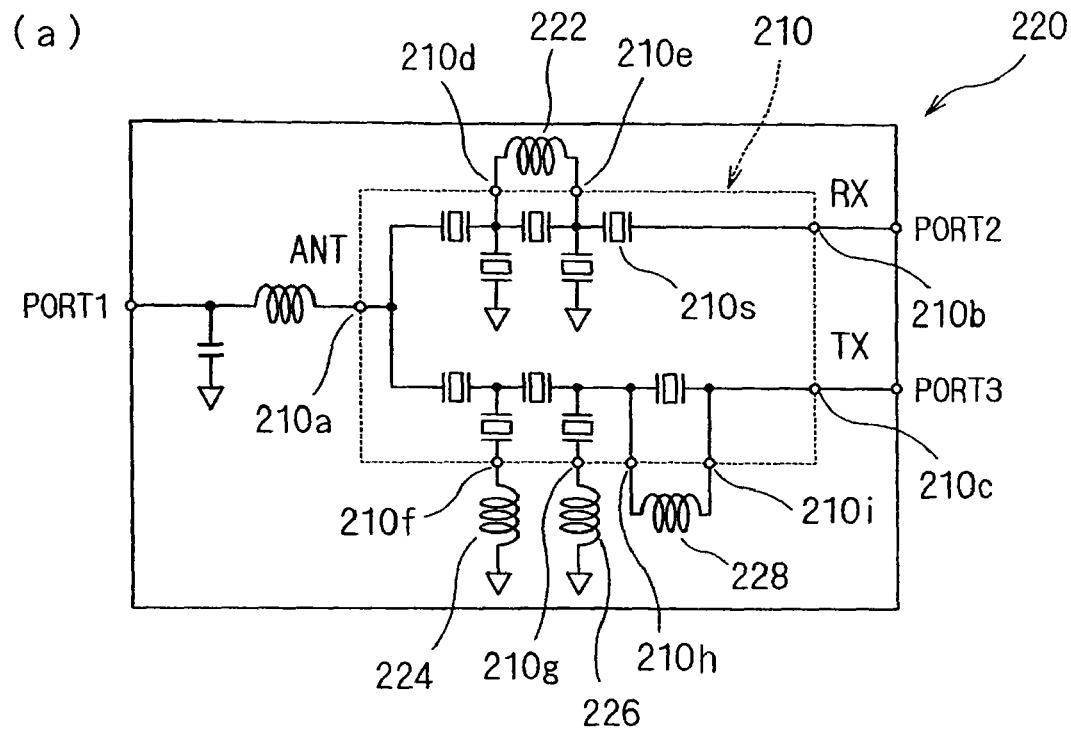
FIG. 28 consists of electrical characteristic graphs of cases in which a duplexer is mounted on (a) a reference jig and (b) a test jig.
Figure 28:
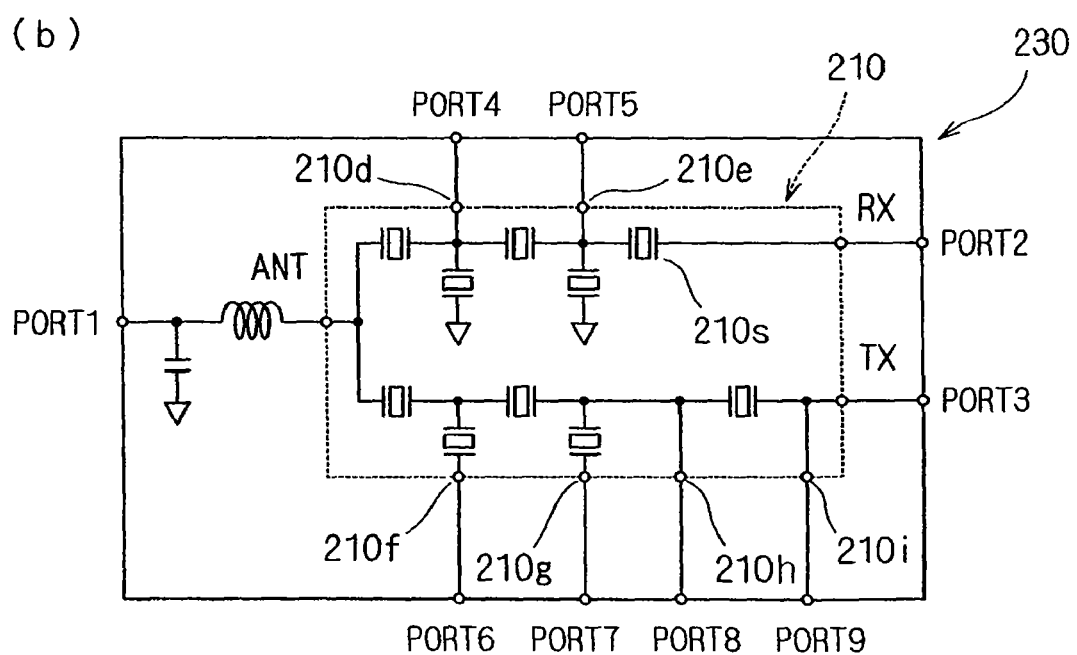
Figure 29:
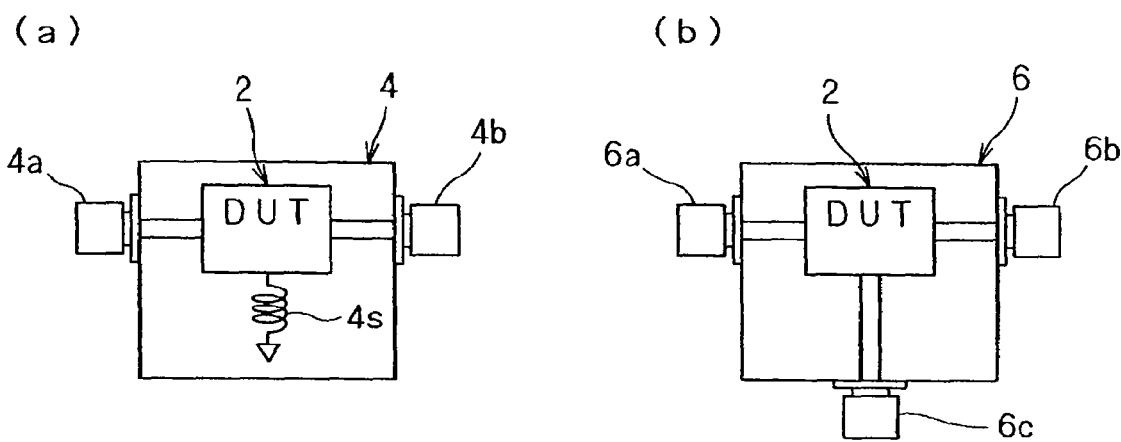
FIG. 29 consists of illustrations of a reference jig and a test jig for use in an electronic component of a "shunt type".
Figure 30:
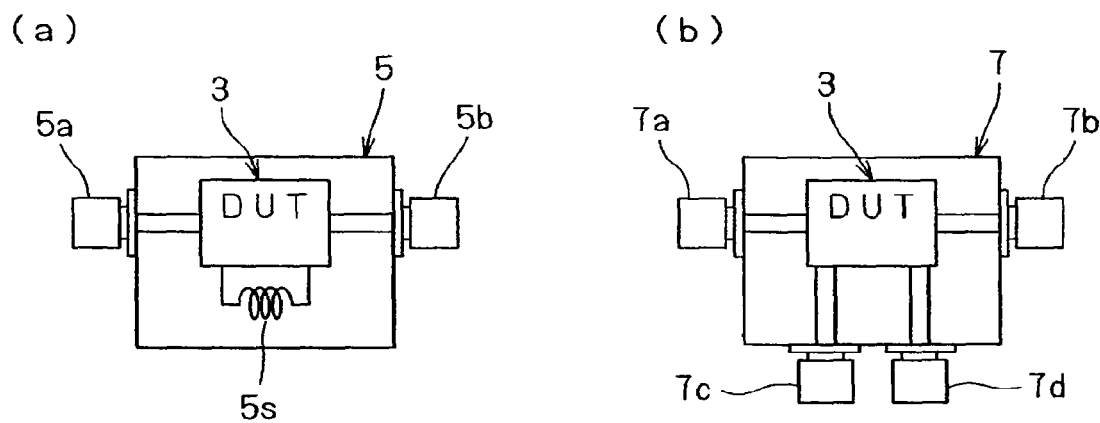
FIG. 30 consists of illustrations of a reference jig and a test jig for use in an electronic component of a "float type".

As shown in, for example, FIG. 28, a duplexer 210 including a plurality of resonators 210s includes signal line ports 210a to 210c, nonsignal line ports 210f and 210g of the "shunt type", and nonsignal line ports 210d, 210e, 210h, and 210i of the "float type". The present invention is also applicable to this duplexer 210. In this case, as shown in FIG. 28(a), in a state with the duplexer 210 mounted on the reference jig 220, elements 222, 224, 226, and 228 of the reference jig 220 are connected to the nonsignal line ports 210d to 210i. Accordingly, the signal line ports 210a to 210c, that is, only ports 1 to 3, are measured. As shown in FIG. 28(b), in a state with the duplexer 210 mounted on a test jig 230, ports 1 to 9, that is, signal line ports 210a to 210c, and nonsignal line ports 210d to 210i are measured.

Although the present invention has been described in relation to particular embodiments thereof, many other variations and modifications and other uses will become apparent to those skilled in the art. Therefore, the present invention is not limited by the specific disclosure herein.

What is claimed is:

1. A measurement error correcting method in which, regarding an electronic component including signal line ports connected to signal lines concerning application or detection of a radio frequency signal, and nonsignal line ports other than the signal line ports, from results of measuring the signal line ports and the nonsignal line ports, with the electronic component mounted on a test jig, an estimated electrical characteristic value of the electronic component that will be obtained if the signal line ports are measured with the electronic component mounted on a reference jig enabling measuring only the signal line ports is calculated, the measurement error correcting method comprising:

a first step of, with at least three types of correcting-data-acquisition samples mounted on the test jig, and the at least three types of correcting-data-acquisition samples mounted on the reference jig, sequentially measuring an electrical characteristic of at least one of signal line ports of each of the at least three types of correcting-data-acquisition samples;

a second step of preparing a correcting-data-acquisition through device in which at least one of signal line ports and at least one of nonsignal line ports are electrically connected to each other, measuring the signal line port and the nonsignal line port, with the correcting-data-acquisition through device mounted on the test jig, and measuring the signal line port, with the correcting-data-acquisition through device mounted on the reference jig;

a third step of determining, on the basis of measurement values obtained in the first and second steps, a numerical expression that includes a first term for the signal line ports and a second term for the nonsignal line ports for calculating, from the results of measuring the signal line ports and the nonsignal line ports, with the electronic component mounted on the test jig, the estimated electrical characteristic value of the electronic component that will be obtained if the signal line ports are measured with the electronic component mounted on the reference jig;

a fourth step of measuring the signal line ports and the nonsignal line ports, with the electronic component which is arbitrarily selected, mounted on the test jig; and a fifth step of calculating, on the basis of measurement values obtained in the fourth step, by using the numerical expression determined in the third step, the estimated electrical characteristic value of the electronic component that will be obtained if the signal line ports are measured with the electronic component mounted on the reference jig.

2. The measurement error correcting method according to claim 1, wherein, in the third step, the second term of the numerical expression for the nonsignal line ports is represented by the following expression:

$$C2\Gamma = \frac{S_{11D} - S_{11I}}{S_{11D} * S_{22I} - S_{11I} * S_{22I} + S_{21I} * S_{12I}} \quad \text{[Expression 1]}$$

by using scattering matrix $S_I$ whose elements are represented by $S_{11I}$, $S_{12I}$, $S_{21I}$, and $S_{22I}$ obtained such that the results of measuring, in the second step, the signal line ports and the nonsignal line ports, with the correcting-data-acquisition through device mounted on the test jig, are substituted for the first term of the numerical expression for calculating, from the results of measuring the signal line ports, with the electronic component mounted on the test jig, the estimated electrical characteristic value of the electronic component that will be obtained if the signal line ports are measured with the electronic component mounted on the reference jig, and measurement value $S_{11D}$ for the signal line port in a state in which the correcting-data-acquisition through device in the second step is mounted on the reference jig.

3. The measurement error correcting method according to claim 1, wherein:

the electronic component includes at least both first and second line ports as the signal line ports and at least both first and second nonsignal line ports as the nonsignal line ports, with an element connected between the first and second nonsignal line ports;

in order to calculate an estimated electrical characteristic value between the first and second signal line ports, which are affected by the first and second nonsignal line ports of the electronic component, the following steps are performed:

in the first step, measuring electrical characteristics at the signal line ports, for each of the correcting-data-acquisition samples, corresponding to the first and second signal line ports of the electronic component;

in the second step, in the correcting-data-acquisition through device, establishing electrical connection between a signal line port of the correcting-data-acquisition through device which corresponds to the first signal line port of the electronic component, and a nonsignal line port of the correcting-data-acquisition through device which corresponds to the first nonsignal line port of the electronic component, and electrical connection is established between a signal line port of the correcting-data-acquisition through device which corresponds to the second signal line port of the electronic component, and a nonsignal line port of the correcting-data-acquisition through device which corresponds to the second nonsignal line port of the electronic component;

in the third step, using as the second term of the numerical expression for calculating the estimated electrical characteristic value between the first and second signal line ports, which are affected by the first and second nonsignal line ports of the electronic component, a transmission parameter matrix as represented by the following expression:

$$(CA) = (T1_{thru})^{-1} \cdot (D_{thru}) \cdot (T2_{thru})^{-1}$$

or a scattering parameter matrix obtained by transforming the transmission parameter matrix by using: transmission parameter matrix ($T1_{thru}$) for between the signal line port corresponding to the first signal line port of the electronic component and the nonsignal line port corresponding to the first nonsignal line port of the electronic component, transmission parameter matrix ($T2_{thru}$) for between the signal line port corresponding to the second signal line port of the electronic component and the nonsignal line port corresponding to the second nonsignal line port of the electronic component, both transmission parameter matrices being obtained such that the results of measuring, in the second step, the signal line ports and the nonsignal line ports, with the correcting-data-acquisition through device mounted on the test jig, are substituted for the first term of the numerical expression for calculating, from the results of measuring the signal line ports, with the electronic component mounted on the test jig, the estimated electrical characteristic value of the electronic component that will be obtained if the signal line ports are measured with the electronic component mounted on the reference jig; and transmission parameter matrix ($D_{thru}$) between the signal line ports corresponding to the first and second signal line ports of the electronic component in a state in which the correcting-data-acquisition through device obtained in the second step is mounted on the test jig.

4. The measurement error correcting method according to one of claim 1, 2, or 3, wherein, in the fifth step of calculating, assuming a relative correction adapter having a feature of changing the electrical characteristic measured with the electronic component mounted on the test jig into an electrical characteristic measured with the electronic component mounted on the reference jig, for the nonsignal line ports, the second term of the numerical expression for the nonsignal line ports in the third step is used as the relative correction adapter for estimation.

5. The measurement error correcting method according to claim 4, wherein the correcting-data-acquisition through device measured in the second step comprises a transmission parameter between the signal line port and the nonsignal line port that is equal to −10 dB or greater.

6. The measurement error correcting method according to claim 1, wherein the correcting-data-acquisition through device measured in the second step comprises a transmission parameter between the signal line port and the nonsignal line port that is equal to −10 dB or greater.

7. An electronic component characteristic measuring device in which, regarding an electronic component including signal line ports connected to signal lines concerning application or detection of a radio frequency signal, and nonsignal line ports other than the signal line ports, from results of measuring the signal line ports and the nonsignal line ports, with the electronic component mounted on a test jig, an estimated electrical characteristic value of the electronic component that will be obtained if the signal line ports are measured with the electronic component mounted on a reference jig enabling measuring only the signal line ports is calculated, the electronic component characteristic measuring device comprising:

measurement means for measuring the signal line ports and the nonsignal line ports, with the electronic component mounted on the test jig;

storage means for storing first measurement data obtained such that, with at least three types of correcting-data-acquisition samples mounted on the test jig, and the at least three types of correcting-data-acquisition samples mounted on the reference jig, an electrical characteristic of at least one of signal line ports of each of the at least three types of correcting-data-acquisition samples is sequentially measured, second measurement data obtained such that, with a correcting-data-acquisition through device mounted on the test jig, the correcting-data-acquisition through device having electrical connection between at least one signal line port among signal line ports and at least one nonsignal line port among nonsignal line ports, the signal line port and the nonsignal line port are measured with the correcting-data-acquisition through device mounted on the test jig, third measurement data obtained by measuring the signal line port, with the correcting-data-acquisition through device mounted on the reference jig;

numerical expression determining means which, on the basis of the first data to third data stored in the storage means, determines a numerical expression that includes a first term for the signal line ports and a second term for the nonsignal line ports for calculating, from the results of measuring the signal line ports and the nonsignal line ports, with the electronic component mounted on the test jig, the estimated electrical characteristic value of the electronic component that will be obtained if the signal line ports are measured with the electronic component mounted on the reference jig; and electrical characteristic estimating means which, for the electronic component which is arbitrarily selected, on the basis of measurement values obtained by measurement of the measurement means, by using the numerical expression determined by the numerical expression determining means, determines the estimated electrical characteristic value of the electronic component that will be obtained if the signal line ports are measured with the electronic component mounted on the reference jig.

8. The electronic component characteristic measuring device according to claim 7, wherein the second term of the numerical expression determined for the nonsignal line ports by the numerical expression determining means is represented by the following expression:

$$C2\Gamma = \frac{S_{11D} - S_{11I}}{S_{11D} * S_{22I} - S_{11I} * S_{22I} + S_{21I} * S_{12I}} \quad \text{[Expression 2]}$$

by using scattering matrix $S_I$ whose elements are represented by $S_{11I}$, $S_{12I}$, $S_{21I}$, and $S_{22I}$ obtained such that the second measurement data is substituted for the first term of the numerical expression for calculating, from the results of measuring the signal line ports, with the electronic component mounted on the test jig, the estimated electrical characteristic value of the electronic component that will be obtained if the signal line ports are measured with the electronic component mounted on the reference jig, the numerical expression being obtained from the first measurement data, and measurement value $S_{11D}$ for the signal line port in a state in which the correcting-data-acquisition through device, which is the third data, is mounted on the reference jig.

9. The electronic component characteristic measuring device according to claim 7, wherein:

the electronic component includes at least both first and second line ports as the signal line ports and at least both first and second nonsignal line ports as the nonsignal line ports, with an element connected between the first and second nonsignal line ports;

for the first measurement data, electrical characteristics are measured at the signal line ports, for each of the correcting-data-acquisition samples, corresponding to the first and second signal line ports of the electronic component;

the correcting-data-acquisition through device for use in obtaining the second measurement data and the third measurement data has electrical connection between a signal line port of the correcting-data-acquisition through device which corresponds to the first signal line port of the electronic component, and a nonsignal line port of the correcting-data-acquisition through device which corresponds to the first nonsignal line port of the electronic component, and electrical connection between a signal line port of the correcting-data-acquisition through device which corresponds to the second signal line port of the electronic component, and a nonsignal line port of the correcting-data-acquisition through device which corresponds to the second nonsignal line port of the electronic component;

as the second term of the numerical expression that is determined by the numerical expression determining means, to calculate the estimated electrical characteristic value between the first and second signal line ports, which are affected by the first and second nonsignal line ports of the electronic component, a transmission parameter matrix as represented by the following expression:

$$(CA) = (T1_{thru})^{-1} \cdot (D_{thru}) \cdot (T2_{thru})^{-1}$$

or a scattering parameter matrix obtained by transforming the transmission parameter matrix is used by using: transmission parameter matrix ($T1_{thru}$) for between the signal line port corresponding to the first signal line port of the electronic component and the nonsignal line port corresponding to the first nonsignal line port of the electronic component, transmission parameter matrix ($T2_{thru}$) for between the signal line port corresponding to the second signal line port of the electronic component and the nonsignal line port corresponding to the second nonsignal line port of the electronic component, both transmission parameter matrices being obtained by substituting the second measurement data for the first term of the numerical expression for calculating, from the results of measuring the signal line ports, with the electronic component mounted on the test jig, the estimated electrical characteristic value of the electronic component that will be obtained if the signal line ports are measured with the electronic component mounted on the reference jig, the numerical expression being obtained from the first measurement data; and transmission parameter matrix ($D_{thru}$), obtained from the third measurement data, between the signal line ports corresponding to the first and second signal line ports of the electronic component in a state with the correcting-data-acquisition through device mounted on the test jig.

10. The electronic component characteristic measuring device according to one of claim 7, 8, or 9, wherein, in the electrical characteristic estimating means, regarding the electronic component, which is arbitrarily selected, assuming a relative correction adapter having a feature of changing the electrical characteristic measured with the electronic component mounted on the test jig into an electrical characteristic measured with the electronic component mounted on the reference jig, for the nonsignal line ports, the second term of the numerical expression for the nonsignal line ports determined for the nonsignal line ports by the numerical expression determining means is used as the relative correction adapter for estimation.

11. The electronic component characteristic measuring device according claim 10, wherein the correcting-data-acquisition through device for acquiring the second measurement data and the third measurement data comprises a transmission parameter between the signal line port and the nonsignal line port that is equal to −10 dB or greater.

12. The electronic component characteristic measuring device according claim 7, wherein the correcting-data-acquisition through device for acquiring the second measurement data and the third measurement data comprises a transmission parameter between the signal line port and the nonsignal line port is that equal to −10 dB or greater.

13. An electronic component characteristic measuring device in which, regarding an electronic component including signal line ports connected to signal lines concerning application or detection of a radio frequency signal, and nonsignal line ports other than the signal line ports, from results of measuring the signal line ports and the nonsignal line ports, with the electronic component mounted on a test jig, an estimated electrical characteristic value of the electronic component that will be obtained if the signal line ports are measured with the electronic component mounted on a reference jig enabling measuring only the signal line ports is calculated, the electronic component characteristic measuring device comprising:
  measurement means for measuring the signal line ports and the nonsignal line ports, with the electronic component mounted on the test jig;
  numerical expression storing means for storing a numerical expression that includes a first term for the signal line ports and a second term for the nonsignal line ports for calculating, from the results of measuring the signal line ports and the nonsignal line ports, with the electronic component mounted on the test jig, the estimated electrical characteristic value of the electronic component that will be obtained if the signal line ports are measured with the electronic component mounted on the reference jig, the numerical expression being determined on the basis of first measurement data obtained such that, with at least three types of correcting-data-acquisition samples mounted on the test jig, and the at least three types of correcting-data-acquisition samples mounted on the reference jig, an electrical characteristic of at least one of signal line ports of each of the at least three types of correcting-data-acquisition samples is sequentially measured, second measurement data obtained such that, with a correcting-data-acquisition through device mounted on the test jig, the correcting-data-acquisition through device having electrical connection between at least one signal line port among signal line ports and at least one nonsignal line port among nonsignal line ports, the signal line port and the nonsignal line port are measured with the correcting-data-acquisition through device mounted on the test jig, and third measurement data obtained by measuring the signal line port, with the correcting-data-acquisition through device mounted on the reference jig; and
  electrical characteristic estimating means which, for the electronic component which is arbitrarily selected, on the basis of measurement values obtained by measurement of the measurement means, by using the numerical expression determined by the numerical expression determining means, determines the estimated electrical characteristic value of the electronic component that will be obtained if the signal line ports are measured with the electronic component mounted on the reference jig.

14. The electronic component characteristic measuring device according to claim 13, wherein the second term of the numerical expression for the nonsignal line ports stored in the numerical expression storing means is represented by the following expression:

$$C2\Gamma = \frac{S_{11D} - S_{11I}}{S_{11D} * S_{22I} - S_{11I} * S_{22I} + S_{21I} * S_{12I}} \quad \text{[Expression 3]}$$

by using scattering matrix $S_I$ whose elements are represented by $S_{11I}$, $S_{12I}$, $S_{21I}$, and $S_{22I}$ obtained such that the second measurement data is substituted for the first term of the numerical expression for calculating, from the results of measuring the signal line ports, with the electronic component mounted on the test jig, the estimated electrical characteristic value of the electronic component that will be obtained if the signal line ports are measured with the electronic component mounted on the reference jig, the numerical expression being obtained from the first measurement data, and measurement value $S_{11D}$ for the signal line port in a state in which the correcting-data-acquisition through device, which is the third data, is mounted on the reference jig.

15. The electronic component characteristic measuring device according to claim 13, wherein:
  the electronic component includes at least both first and second line ports as the signal line ports and at least both first and second nonsignal line ports as the nonsignal line ports, with an element connected between the first and second nonsignal line ports;
  for the first measurement data, electrical characteristics are measured at the signal line ports, for each of the correcting-data-acquisition samples, corresponding to the first and second signal line ports of the electronic component;
  the correcting-data-acquisition through device for use in obtaining the second measurement data and the third measurement data has electrical connection between a signal line port of the correcting-data-acquisition through device which corresponds to the first signal line port of the electronic component, and a nonsignal line port of the correcting-data-acquisition through device which corresponds to the first nonsignal line port of the electronic component, and electrical connection between a signal line port of the correcting-data-acquisition through device which corresponds to the second signal line port of the electronic component, and a nonsignal line port of the correcting-data-acquisition through device which corresponds to the second nonsignal line port of the electronic component;

as the second term of the numerical expression that is stored in the numerical expression storing means, to calculate the estimated electrical characteristic value between the first and second signal line ports, which are affected by the first and second nonsignal line ports of the electronic component, a transmission parameter matrix as represented by the following expression:

$$(CA) = (T1_{thru})^{-1} \cdot (D_{thru}) \cdot (T2_{thru})^{-1}$$

or a scattering parameter matrix obtained by transforming the transmission parameter matrix is used by using: transmission parameter matrix ($T1_{thru}$) for between the signal line port corresponding to the first signal line port of the electronic component and the nonsignal line port corresponding to the first nonsignal line port of the electronic component, transmission parameter matrix ($T2_{thru}$) for between the signal line port corresponding to the second signal line port of the electronic component and the nonsignal line port corresponding to the second nonsignal line port of the electronic component, both transmission parameter matrices being obtained by substituting the second measurement data for the first term of the numerical expression for calculating, from the results of measuring the signal line ports, with the electronic component mounted on the test jig, the estimated electrical characteristic value of the electronic component that will be obtained if the signal line ports are measured with the electronic component mounted on the reference jig, the numerical expression being obtained from the first measurement data, and transmission parameter matrix ($D_{thru}$), between the signal line ports corresponding to the first and second signal line ports of the electronic component in a state with the correcting-data-acquisition through device mounted on the test jig, obtained from the third measurement data.

16. The electronic component characteristic measuring device according to one of claim 13, 14, or 15, wherein, in the electrical characteristic estimating means, regarding the electronic component, which is arbitrarily selected, assuming a relative correction adapter having a feature of changing the electrical characteristic measured with the electronic component mounted on the test jig into an electrical characteristic measured with the electronic component mounted on the reference jig, for the nonsignal line ports, the second term of the numerical expression for the nonsignal line ports determined for the nonsignal line ports by the numerical expression determining means is used as the relative correction adapter for estimation.

17. The electronic component characteristic measuring device according claim 10 wherein the correcting-data-acquisition through device for acquiring the second measurement data and the third measurement data comprises a transmission parameter between the signal line port and the nonsignal line port that is equal to −10 dB or greater.

18. The electronic component characteristic measuring device according claim 13 wherein the correcting-data-acquisition through device for acquiring the second measurement data and the third measurement data comprises a transmission parameter between the signal line port and the nonsignal line port is that equal to −10 dB or greater.

* * * * *